(12) United States Patent
Cheng et al.

(10) Patent No.: US 10,745,271 B2
(45) Date of Patent: Aug. 18, 2020

(54) METHOD FOR INTEGRATING COMPLEMENTARY METAL-OXIDE-SEMICONDUCTOR (CMOS) DEVICES WITH MICROELECTROMECHANICAL SYSTEMS (MEMS) DEVICES USING A FLAT SURFACE ABOVE A SACRIFICIAL LAYER

(71) Applicant: Taiwan Semiconductor Manufacturing Co., Ltd., Hsin-Chu (TW)

(72) Inventors: Chun-Wen Cheng, Zhubei (TW); Chia-Hua Chu, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/587,274

(22) Filed: Sep. 30, 2019

(65) Prior Publication Data

US 2020/0024135 A1    Jan. 23, 2020

Related U.S. Application Data

(60) Continuation of application No. 16/167,912, filed on Oct. 23, 2018, now Pat. No. 10,472,233, which is a (Continued)

(51) Int. Cl.
*H01L 23/532* (2006.01)
*B81C 1/00* (2006.01)
*H01L 21/82* (2006.01)

(52) U.S. Cl.
CPC .......... *B81C 1/00246* (2013.01); *H01L 21/82* (2013.01); *H01L 23/53295* (2013.01);
(Continued)

(58) Field of Classification Search
CPC ......... H01L 21/02296; H01L 21/02436; H01L 21/02518; H01L 21/64; H01L 21/702; H01L 21/71
See application file for complete search history.

(56) References Cited

U.S. PATENT DOCUMENTS 7,923,790 B1   4/2011   Quevy et al.
8,278,802 B1   10/2012  Lee et al.
(Continued)

FOREIGN PATENT DOCUMENTS

JP    2006041345 A    2/2006
TW    201002610       1/2010
(Continued)

OTHER PUBLICATIONS

Notice of Allowance dated Jun. 6, 2017 for U.S. Appl. No. 15/363,571.
(Continued)

*Primary Examiner* — Cheung Lee
(74) *Attorney, Agent, or Firm* — Eschweiler & Potashnik, LLC

(57) ABSTRACT

An integrated circuit (IC) with an integrated microelectromechanical systems (MEMS) structure is provided. In some embodiments, the IC comprises a semiconductor substrate, a back-end-of-line (BEOL) interconnect structure, the integrated MEMS structure, and a cavity. The BEOL interconnect structure is over the semiconductor substrate, and comprises wiring layers stacked in a dielectric region. Further, an upper surface of the BEOL interconnect structure is planar or substantially planar. The integrated MEMS structure overlies and directly contacts the upper surface of the BEOL interconnect structure, and comprises an electrode layer. The cavity is under the upper surface of the BEOL interconnect structure, between the MEMS structure and the BEOL interconnect structure.

20 Claims, 17 Drawing Sheets

Related U.S. Application Data division of application No. 15/716,676, filed on Sep. 27, 2017, now Pat. No. 10,138,116, which is a continuation of application No. 15/363,571, filed on Nov. 29, 2016, now Pat. No. 9,796,582.

(52) U.S. Cl.
CPC ............... *B81C 2203/0735* (2013.01); *B81C 2203/0771* (2013.01); *H01L 2924/1461* (2013.01)

(56) References Cited

U.S. PATENT DOCUMENTS

| | | |
|---|---|---|
| 8,987,059 B2 | 3/2015 | Liang et al. |
| 9,040,334 B2 | 5/2015 | Chu et al. |
| 9,065,358 B2 | 6/2015 | Tsai et al. |
| 9,085,455 B2 | 7/2015 | Cheng et al. |
| 9,085,456 B2 | 7/2015 | Tsai et al. |
| 9,122,827 B2 | 9/2015 | Chen et al. |
| 9,133,017 B2 | 9/2015 | Liang et al. |
| 9,138,994 B2 | 9/2015 | Peng et al. |
| 9,139,420 B2 | 9/2015 | Chang et al. |
| 9,139,423 B2 | 9/2015 | Chien et al. |
| 9,181,083 B2 | 11/2015 | Tsai et al. |
| 9,187,317 B2 | 11/2015 | Cheng et al. |
| 9,233,839 B2 | 1/2016 | Liu et al. |
| 9,236,877 B2 | 1/2016 | Peng et al. |
| 9,238,581 B2 | 1/2016 | Wu et al. |
| 2012/0098122 A1 | 4/2012 | Yang |
| 2012/0274647 A1 | 11/2012 | Lan et al. |
| 2013/0015743 A1 | 1/2013 | Tsai et al. |
| 2014/0252508 A1 | 9/2014 | Cheng et al. |
| 2014/0287548 A1 | 9/2014 | Lin et al. |
| 2015/0137303 A1 | 5/2015 | Chou et al. |
| 2015/0175405 A1 | 6/2015 | Cheng |
| 2015/0175407 A1 | 6/2015 | Cheng et al. |
| 2015/0196912 A1 | 7/2015 | Tsai et al. |
| 2015/0298170 A1 | 10/2015 | Rothberg et al. |
| 2016/0122182 A1 | 5/2016 | Cheng et al. |
| 2016/0137492 A1 | 5/2016 | Cheng et al. |
| 2016/0155763 A1 | 6/2016 | Cheng et al. |
| 2017/0057814 A1 | 3/2017 | Cheng et al. |
| 2018/0029882 A1 | 2/2018 | Cheng et al. |

FOREIGN PATENT DOCUMENTS

| | | |
|---|---|---|
| TW | 201113979 | 4/2011 |
| TW | 201312649 | 3/2013 |
| WO | 2016007250 | 1/2016 |

OTHER PUBLICATIONS

Non-Final Office Action dated Mar. 2, 2018 for U.S. Appl. No. 15/716,676.

Notice of Allowance dated Jul. 16, 2018 for U.S. Appl. No. 15/716,676.

Non-Final Office Action dated Mar. 14, 2019 for U.S. Appl. No. 16/167,912.

Notice of Allowance dated Jul. 5, 2019 for U.S. Appl. No. 16/167,912.

United States Patent US 10,745,271 B2

METHOD FOR INTEGRATING COMPLEMENTARY METAL-OXIDE-SEMICONDUCTOR (CMOS) DEVICES WITH MICROELECTROMECHANICAL SYSTEMS (MEMS) DEVICES USING A FLAT SURFACE ABOVE A SACRIFICIAL LAYER

REFERENCE TO RELATED APPLICATIONS

This application is a Continuation of U.S. application Ser. No. 16/167,912, filed on Oct. 23, 2018, which is a Divisional of U.S. application Ser. No. 15/716,676, filed on Sep. 27, 2017 (now U.S. Pat. No. 10,138,116, issued on Nov. 27, 2018), which is a Divisional of U.S. application Ser. No. 15/363,571, filed on Nov. 29, 2016 (now U.S. Pat. No. 9,796,582, issued on Oct. 24, 2017). The contents of the above-referenced applications are hereby incorporated by reference in their entirety.

BACKGROUND

Complementary metal-oxide-semiconductor (CMOS) is a technology for constructing integrated circuits. CMOS technology is used in digital logic circuits. Furthermore, CMOS technology may be used in conjunction with microelectromechanical systems (MEMS) devices. MEMS devices are microscopic devices that integrate mechanical and electrical components to sense physical quantities and/or to act upon surrounding environments. In recent years, MEMS devices have become increasingly common. For example, MEMS accelerometers are commonly found in airbag deployment systems, tablet computers, and smart phones.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
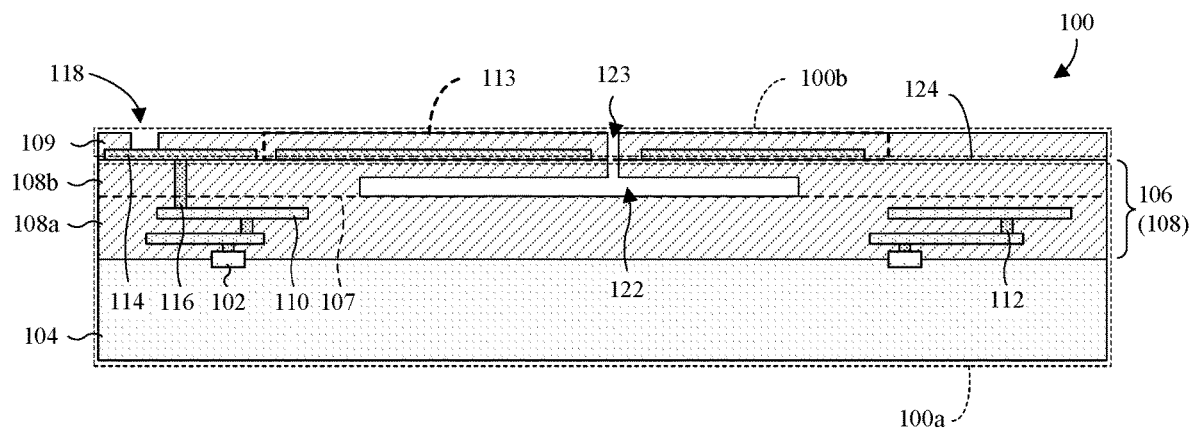
FIG. 1 illustrates a cross-sectional view of some embodiments of an integrated circuit (IC) that comprise complementary metal-oxide-semiconductor (CMOS) devices integrated with a microelectromechanical systems (MEMS) device.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Microelectromechanical (MEMS) devices are often packaged with and electrically coupled to complementary metal-oxide-semiconductor (CMOS) devices. One method for doing so is to bond a MEMS die and a CMOS die together and to electrically couple the MEMS die to the CMOS die using wire bonding. However, wire bonding results in a large amount of parasitic capacitance that leads to low performance. Further, the method is performed at the die level, such that the method has high packaging time and high packaging complexity, thereby leading to high costs.

Another method for packaging and electrically coupling MEMS devices and CMOS devices together is to form the MEMS devices directly on CMOS dies using sacrificial layers. For example, a sacrificial layer may be formed and patterned over a CMOS die, such that the BEOL interconnect structure of the CMOS die is between the sacrificial layer and a semiconductor substrate of the CMOS die. Further, a MEMS structure comprising a MEMS device may be conformally formed over the BEOL interconnect structure and the sacrificial layer, and a release hole may be formed extending through the MEMS structure to the sacrificial layer. With the release hole formed, an etchant may be applied to the sacrificial layer, through the release hole, to at least partially remove the sacrificial layer and to form a cavity between the CMOS die and the MEMS structure.

A challenge with foregoing method is that the MEMS structure is formed on a non-flat surface. As such, the MEMS structure is non-planar and has a step up along sidewalls of the sacrificial layer that remains even after the sacrificial layer is removed. This may result in photolithography and etching process difficulty. Furthermore, the step up may result in poor anchor support and rigidity for the MEMS structure. One approach for addressing this challenge is to use a dielectric layer of the BEOL interconnect structure for the sacrificial layer. This allows the MEMS structure to be formed on a flat surface. On the other hand, however, wiring layers of the BEOL interconnect structure may peel, and/or interlayer dielectric (ILD) layers of the CMOS die may become damaged.

In view of the foregoing, the present application, in various embodiments, is directed towards a method for integrating CMOS devices with a MEMS device using a flat surface above a sacrificial layer, as well as integrated circuits (ICs) resulting from the method. In some first embodiments of the method, a BEOL interconnect structure is formed covering a semiconductor substrate. Forming the BEOL interconnect structure comprises forming a plurality of wiring layer stacked in a first BEOL dielectric region of the BEOL interconnect structure. A sacrificial layer is formed over the first BEOL dielectric region. A second BEOL dielectric region is formed overlying the sacrificial layer. The second BEOL dielectric region is planarized such that an upper surface of the second BEOL dielectric region is substantially flat (i.e., planar). A MEMS structure is formed on the upper surface of the second BEOL dielectric region, and a cavity etch is performed to remove the sacrificial layer and to form a cavity in place of the sacrificial layer. In some embodiments, a via is formed extending through the second BEOL dielectric region, into the first BEOL dielectric region, to a top wiring layer of the BEOL interconnect structure and electrically coupling the MEMS structure to the top wiring layer.

In some second embodiments of the method, a BEOL interconnect structure is formed covering a semiconductor substrate. Forming the BEOL interconnect structure comprises forming a plurality of wiring layer stacked in a first BEOL dielectric region of the BEOL interconnect structure. A trench is formed in the BEOL interconnect structure. A sacrificial layer is formed in the trench of the BEOL interconnect structure such that the sacrificial layer is inset into the BEOL interconnect structure. The BEOL interconnect structure and the inset sacrificial layer are coplanarized such that upper surfaces respectively of the BEOL interconnect structure and the inset sacrificial layer are substantially coplanar. A MEMS structure is formed on the upper surfaces respectively of the BEOL interconnect structure and the inset sacrificial layer, and a cavity etch is performed to remove the sacrificial layer and to form a cavity in place of the sacrificial layer. In some embodiments, a via is formed extending into the first BEOL dielectric region to a top wiring layer of the BEOL interconnect structure and electrically coupling the MEMS structure to the top wiring layer.

Advantageously, the first and second embodiments of the method may be performed at the wafer level for low packaging time and low packaging complexity. This, in turn, may lead to low costs. Further, the first and second embodiments of the method may advantageously be performed without wire bonding, such that parasitic capacitance between MEMS and CMOS devices may be low. Further yet, the first and second embodiments of the method may advantageously be performed without an additional wafer and/or a bonding process between wafers, such that the method is monolithic. This, in turn, may lead to low costs. Further yet, forming the MEMS structure on a planar surface may result in good anchor support and rigidity for the MEMS structure, as well as well as a high degree of freedom in photolithography and etching processes used to form the MEMS structure.

With reference to FIG. 1, a cross-sectional view 100 of some embodiments of an IC comprising a CMOS structure 100a and a MEMS structure 100b is provided. As illustrated, the CMOS structure 100a includes CMOS devices 102. The CMOS devices 102 are arranged over a semiconductor substrate 104, recessed below an upper or top surface of the semiconductor substrate 104. The CMOS devices 102 may be, for example, insulated-gate field-effect transistors (IGFETs), metal-oxide-semiconductor field-effect transistors (MOSFETs), some other transistors, a combination of the foregoing, or the like. The semiconductor substrate 104 may be, for example, a bulk substrate of monocrystalline silicon or a bulk substrate of some other semiconductor.

The CMOS structure 100a also includes a BEOL interconnect structure 106 at least partially covering the CMOS devices 102 and the semiconductor substrate 104. The BEOL interconnect structure 106 is configured to electrically couple the CMOS devices 102 to one another and/or to the MEMS structure 100b. The BEOL interconnect structure 106 comprises a BEOL dielectric region 108 having one or more dielectric layers, such as, for example, ILD layers and/or passivation layers. Further, the BEOL dielectric region 108 comprises one or more dielectric regions. For example, the BEOL dielectric region 108 may comprise a first BEOL dielectric region 108a and a second BEOL dielectric region 108b, which are demarcated by a dashed line 107. The BEOL dielectric region 108 may be, for example, silicon dioxide, a low κ dielectric, some other dielectric, a combination of the foregoing, or the like. As used here, a low κ dielectric is a dielectric constant κ less than about 3.9.

Further, the BEOL interconnect structure 106 comprises one or more wiring layers 110 and one or more via layers 112 alternatingly stacked within the BEOL dielectric region 108. The wiring layer(s) 110 and the via layer(s) 112 are conductive and may be, for example, aluminum copper, copper, aluminum, tungsten, some other conductive material, a combination of the foregoing, or the like. Even more, the wiring layer(s) 110 are made of individual wires (not individually labeled), and the via layer(s) 112 are made of individual vias (not individually labeled). Further, the wiring layer(s) 110 and the via layer(s) 112 collectively define conductive paths between the CMOS devices 102 and a MEMS device 113 of the MEMS structure 100b. In some embodiments, the wiring layer(s) 110 and the via layer(s) 112 also define conductive paths between a CMOS devices or the MEMS device 113 and an electrical device external to the IC.

The MEMS structure 100b comprises one or more MEMS layers that collectively define the MEMS device 113, and that are formed on a planar upper surface 124 of the BEOL interconnect structure 106. In some embodiments, the MEMS structure 100b comprises a MEMS dielectric region 109. The MEMS dielectric region 109 may be, for example, the same material as the BEOL dielectric region 108. Further, in some embodiments, the MEMS structure 100b comprises an electrode layer 114 electrically coupled to the BEOL interconnect structure 106 through an inter-device via layer 116. Even more, in some embodiments, the MEMS structure 100b comprises an electrode opening 118 exposing a portion of the electrode layer 114, thereby allowing an electrical device external to the IC to electrically couple with the CMOS devices 102 and/or the MEMS device 113.

Returning to the CMOS structure 100a, the BEOL dielectric region 108 also includes a cavity 122, which is surrounded by the BEOL dielectric region 108 and which is under the planar upper surface 124 of the BEOL interconnect structure 106. Further, the cavity 122 may, for example, overlie at least one of the wiring layer(s) 110, and/or the lower surface of the cavity 122 may, for example, be substantially flat or planar extending to the sidewalls of the cavity 122. In some embodiments, the lower surface of the cavity 122 is defined by an upper surface of the first BEOL dielectric region 108a. Further, in some embodiments, the sidewalls of the cavity 122 are defined by the second BEOL dielectric region 108b, whereas in other embodiments the BEOL dielectric region 108 is without the second BEOL dielectric region 108b and the sidewalls of the cavity 122 are defined by the first BEOL dielectric region 108a. Even more, in some embodiments, a release opening 123 extends through the MEMS structure and opens the cavity 122 to an ambient environment of the IC.

As discussed in detail hereafter, the cavity 122 is formed using a sacrificial layer, which is not shown because it is removed during fabrication. In some first embodiments, the second BEOL dielectric region 108b is omitted and the sacrificial layer is inset into the first BEOL dielectric region 108a. In such embodiments, upper surfaces respectively of the first BEOL dielectric region 108a and the sacrificial layer are coplanarized, and the MEMS structure 100b is formed on the substantially coplanar upper surfaces. In second embodiments, the sacrificial layer is formed over the first BEOL dielectric region 108a, and the second BEOL dielectric region 108b is formed covering the first BEOL dielectric region 108a and the sacrificial layer. In such embodiments, an upper surface of the second BEOL dielectric region 108b is planarized, and the MEMS structure 100b is formed in the substantially planar upper surface. In either the first or second embodiments, the MEMS structure 100b is formed on the planar upper surface 124 of the BEOL interconnect structure 106, which overlies the cavity 122. As such, the MEMS structure 100b does not have a stepped bottom profile, and has good anchor support and rigidity. Furthermore, photolithography and etching processes are simplified when forming the MEMS structure 100b.

With reference to FIGS. 2A-2E, cross-sectional views 200A-200E of some other embodiments of the IC of FIG. 1 are provided.

Figure 2A:
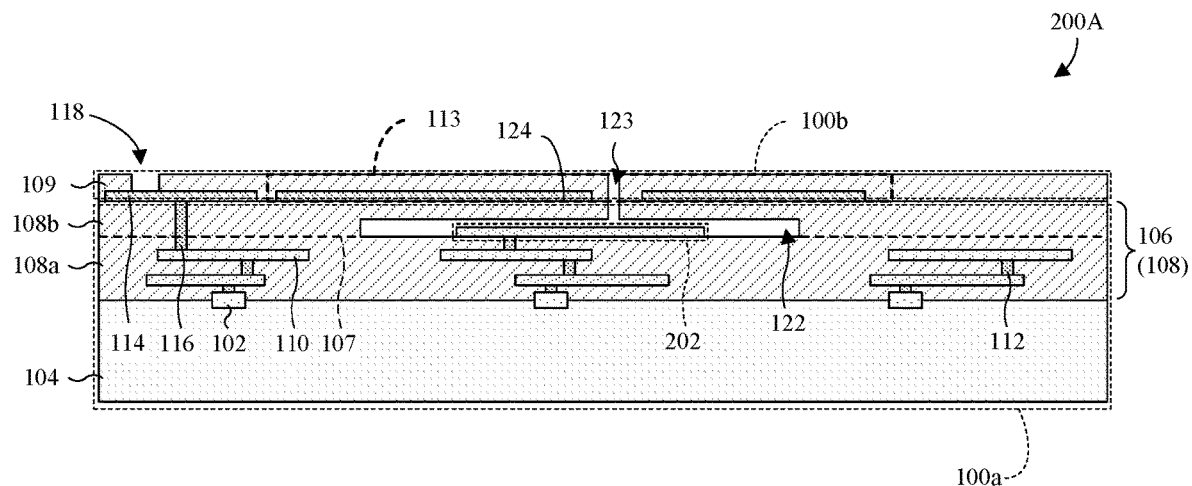
FIGS. 2A-2E illustrate cross-sectional views of some other embodiments of the IC of FIG. 1.

As illustrated by the cross-sectional view 200A of FIG. 2A, the MEMS device 113 is a capacitive MEMS device. As described above with respect FIG. 1, the CMOS devices 102 are arranged over a semiconductor substrate 104 and covered by a BEOL interconnect structure 106. The BEOL interconnect structure 106 comprises a BEOL dielectric region 108 with a second BEOL dielectric region 108b stacked over a first BEOL dielectric region 108a. Further, the BEOL interconnect structure 106 comprises one or more wiring layers 110 and one or more via layers 112 in the BEOL dielectric region 108. Here, the wiring layer(s) 110 and the via layer(s) 112 electrically connect the CMOS devices 102 to the MEMs structure 100b. Further, in some embodiments, the wiring layer(s) 110 comprises one or more capacitive sensing electrodes 202 in a cavity 122 between the first BEOL dielectric region 108a and the second BEOL dielectric region 108b. For example, the capacitive sensing electrode(s) 202 may be arranged over the first dielectric BEOL region 108a within the cavity 122.

In operation, a MEMs device 113 of the MEMS structure 100b that overlies the cavity 122 may, for example, move or vibrate within the cavity 122 in response to an external stimulus. This movement or vibration results in a capacitance change that varies predictably in dependence on the extent of the movement or vibration, such that the capacitance change can be used by the CMOS devices 102 to measure the external stimulus. The external stimulus may be, for example, acceleration and/or movement of the IC, sound waves impinging on the MEMs device 113, or a pressure differential between the cavity 122 and an ambient environment of IC. Alternatively, in operation, the MEMs device 113 may, for example, move or vibrate within the cavity 122 in response to a voltage from the CMOS devices 102. The MEMs device 113 may be, for example, a microphone, an accelerometer, a motion sensor, a pressure sensor, a gyroscope, or the like.

Figure 2B:
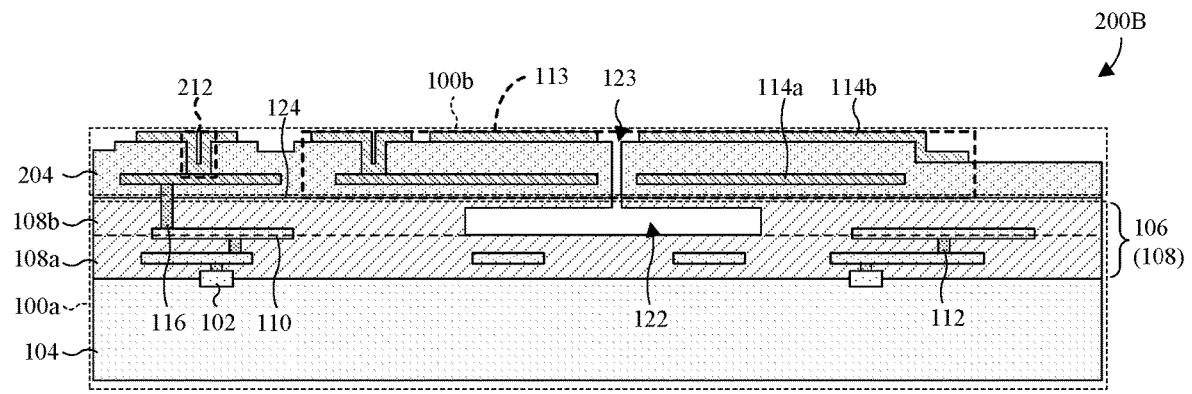

As illustrated by the cross-sectional view 200B of FIG. 2B, a MEMs structure 100b may be electrically coupled to the CMOS devices 102. The MEMs structure 100b includes a piezoelectric layer 204 arranged over the BEOL interconnect structure 106 and the semiconductor substrate 104, and is separated from the cavity 122 by at least a portion of the second BEOL dielectric region 108b. In some embodiments, the second BEOL dielectric region 108b may have an upper portion that covers a portion of the cavity 122. Further, in some embodiments, the upper portion may be laterally discontinuous directly over the cavity 122. The piezoelectric layer 204 may be, for example, aluminum nitride, zinc oxide, lead zirconate titanate, some other piezoelectric material, a combination of the foregoing, or the like.

A first electrode layer 114a and a second electrode layer 114b are respectively arranged in and over the piezoelectric layer 204. Further, the first and second electrode layers 114a, 114b electrically couple to the CMOS devices 102 through the BEOL interconnect structure 106. The first and second electrode layers 114a, 114b comprise corresponding first and second electrodes, and the second electrode layer 114b further comprises one or more through vias 212. At least one of the through via(s) 212 extends through the piezoelectric layer 204 to the first electrode layer 114a and electrically couples the first electrode layer 114a to the second electrode layer 114b. The first and second electrode layers 114a, 114b may be aluminum copper, aluminum, molybdenum, gold, platinum, some other conductive material, a combination of the foregoing, or the like.

As discussed above with respect to FIG. 1, the upper surface 124 of the BEOL dielectric region 108 is planarized such that overlying layers are also planar and do not suffer a step up. For example, here, the piezoelectric layer 204 has a planar lower or bottom surface.

Figure 2C:
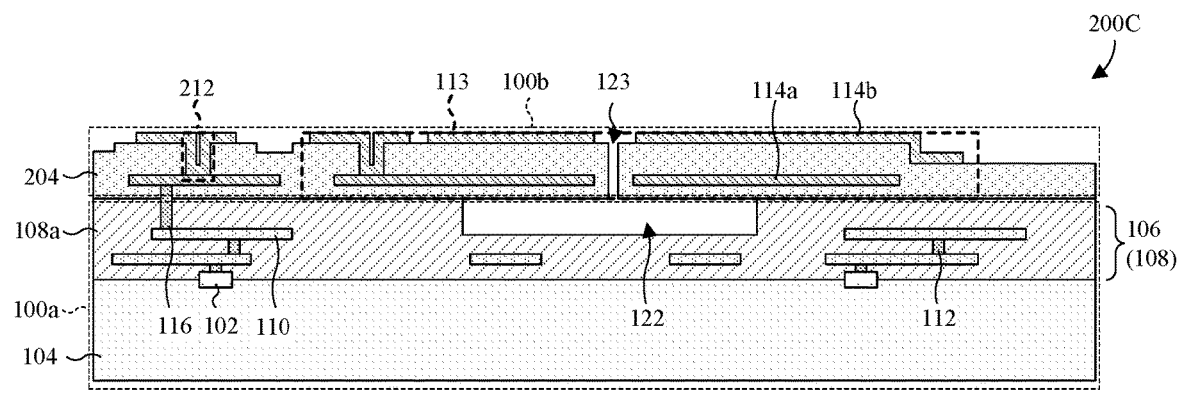

As illustrated by the cross-sectional view 200C of FIG. 2C, a variant of FIG. 2B is provided. Here, in FIG. 2C, the second BEOL dielectric region 108b of FIGS. 2A and 2B is omitted, and the cavity 122 is inset into the first BEOL dielectric region 108a. Further, a lower or bottom surface of the piezoelectric layer 204 is arranged over the cavity 122, on an upper or top surface of the first BEOL dielectric region 108a. While the cavity 122 is recessed in the BEOL interconnect structure 106, the upper surface of the cavity is defined by the lower or bottom surface of the piezoelectric layer 204.

Figure 2D:
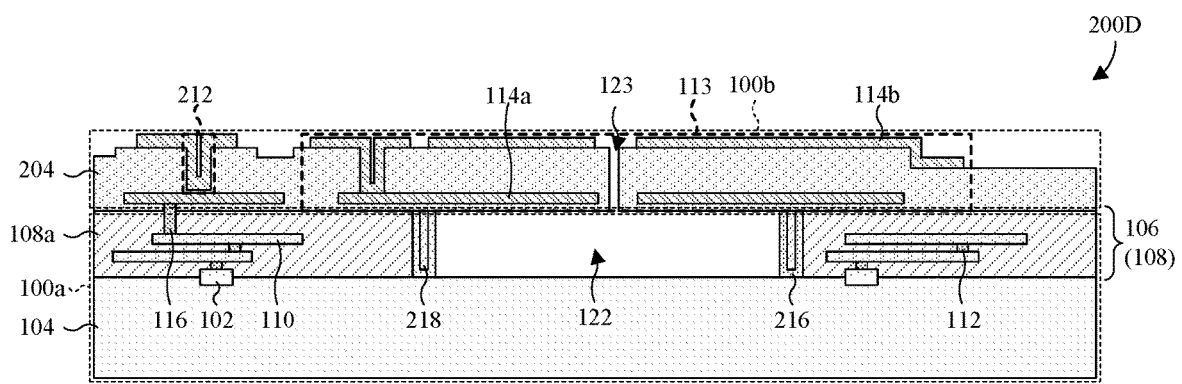

As illustrated by the cross-sectional view 200D of FIG. 2D, a variant of FIG. 2C is provided. Here, the cavity 122 extends through the BEOL interconnect structure 106 to the semiconductor substrate 104. Thus, a bottom surface of the cavity 122 is defined by an upper surface of the semiconductor substrate 104. Further, a top surface of the cavity 122 is defined by a lower or bottom surface of a piezoelectric layer 204.

A lateral etch stop layer 216 is arranged in the cavity 122 and defines sidewalls of cavity 122. The lateral etch stop layer 216 extends vertically from the semiconductor substrate 104 to the piezoelectric layer 204, and extends laterally to enclose the cavity 122. In some embodiments, the lateral etch stop layer 216 is ring-shaped and/or has a U-shaped profile as it extends laterally along a boundary of the cavity 122. Further, in some embodiments, an interior of the U-shaped profile is filled with a filler layer 218. The lateral etch stop layer 216 may be, example, aluminum nitride, aluminum oxide, silicon carbide, or some other material resistant to VHF or BOE. The filler layer 218 may be, for example, silicon dioxide, a low κ dielectric, some other dielectric, a combination of the foregoing, or the like.

Figure 2E:
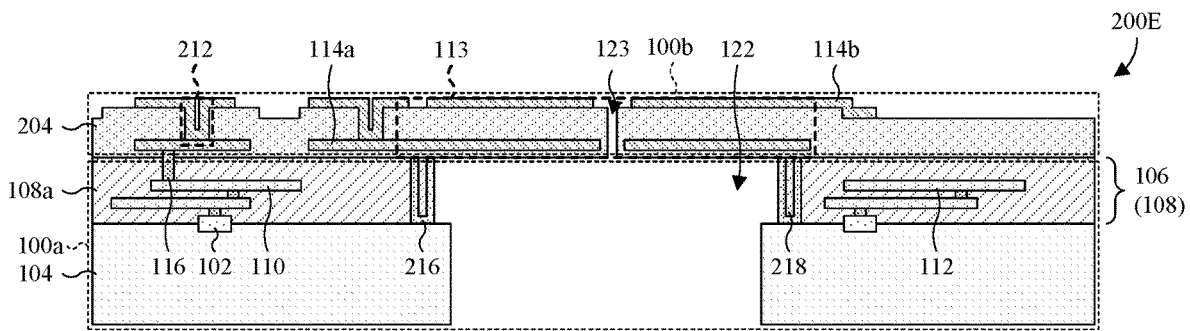

As illustrated by the cross-sectional view 200E of FIG. 2E, a variant of FIG. 2D is provided in which the cavity 122 extends through the semiconductor substrate 104. In such embodiments, a MEMS device 113 of the MEMs structure 100b may be, for example, a microphone, a pressure sensor, a gyroscope, or the like.

While FIGS. 1 and 2A-2E were described with a MEMS structure and a MEMS device, it is to be appreciated that another device structure may be arranged in place of the MEMS structure in some other embodiments. Further, while FIGS. 1 and 2A-2E were described with a MEMS structure and a MEMS device, it is to be appreciated that the MEMS structure and the MEMS device may be omitted in some other embodiments.

With reference to FIGS. 3A-3K, a series of cross-sectional views 300A-300K of some embodiments of a method for manufacturing the IC of FIG. 2A is provided.

Figure 3A:
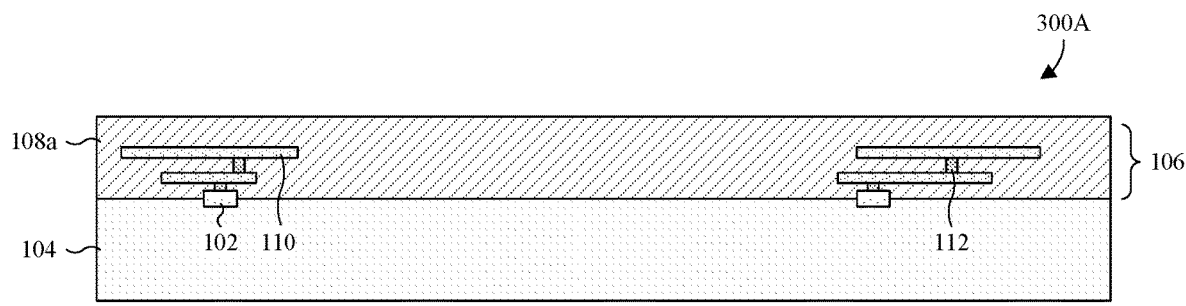
FIGS. 3A-3K illustrate a series of cross-sectional views of some embodiments of a method for manufacturing the IC of FIG. 2A.

As illustrated by the cross-sectional view 300A of FIG. 3A, a BEOL interconnect structure 106 is arranged over a semiconductor substrate 104 having CMOS devices 102 arranged atop a semiconductor substrate 104. The BEOL interconnect structure 106 covers the CMOS devices 102, and accommodates one or more wiring layers 110 and one or more via layers 112 in a first BEOL dielectric region 108a.

The wiring layer(s) 110 and via layer(s) 112 are alternatingly stacked within a first BEOL dielectric region 108a of the BEOL interconnect structure 106, and are electrically coupled to the CMOS devices 102. The wiring layer(s) 110 and via layer(s) 112 may also be, for example, copper, aluminum copper, tungsten, some other metal or conductive material, a combination of the foregoing, or the like. While a certain number of wiring layer and a certain number of via layers are shown in FIG. 3A, it is to be appreciated that more or less wiring layers are amenable, and/or more or less via layers are amenable, in other embodiments.

The first BEOL dielectric region 108a comprises one or more dielectric layers, such as, for example, a plurality of dielectric layers. Further the upper surface of the first BEOL dielectric region 108a may be planarized so that the upper surface of the first BEOL dielectric region 108a is substantially flat or planar. The planarization may, for example, be performed by a chemical mechanical polish (CMP).

Figure 3B:
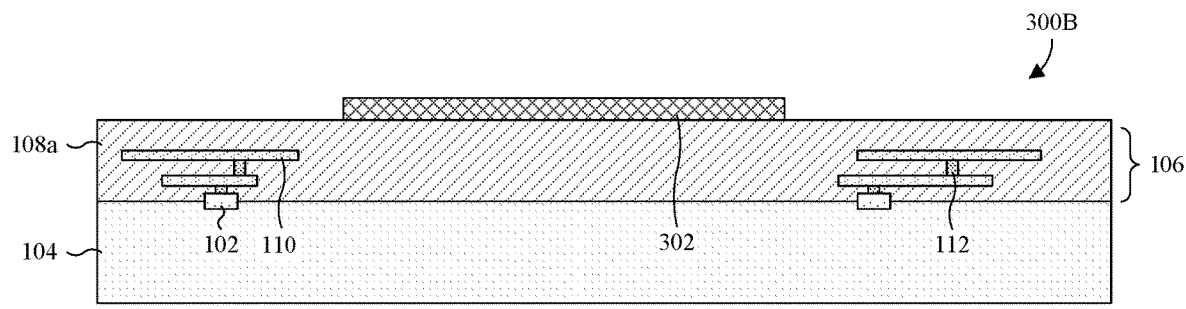

As illustrated by the cross-sectional view 300B of FIG. 3B, a sacrificial layer 302 is formed (e.g., deposited or grown) over the first BEOL dielectric region 108a. The sacrificial layer 302 may be deposited or grown by, for example, thermal oxidation, vapor deposition, sputtering, or some other deposition or growth process. In some embodiments, the sacrificial layer 302 is an amorphous metalloid, amorphous carbon (a-C), amorphous silicon (a-Si), a combination of the foregoing, or the like. In other embodiments, the sacrificial layer 302 is titanium tungsten (TiW), tungsten (W), germanium (Ge), aluminum copper (AlCu), a combination of the foregoing, or the like. The material of the sacrificial layer 302 may, for example, be selected so that the deposition or growth process can be performed at a process temperature of less than about 450 degrees Celsius in order to reduce the possibility of damage to the IC.

Also illustrated by the cross-sectional view 300B of FIG. 3B, the sacrificial layer 302 is patterned over the first BEOL dielectric region 108a. In some embodiments, the sacrificial layer 302 is patterned by photolithography. Further, in some embodiments, the sacrificial layer 302 is patterned such that it has a linear or ring shape.

Figure 3C:
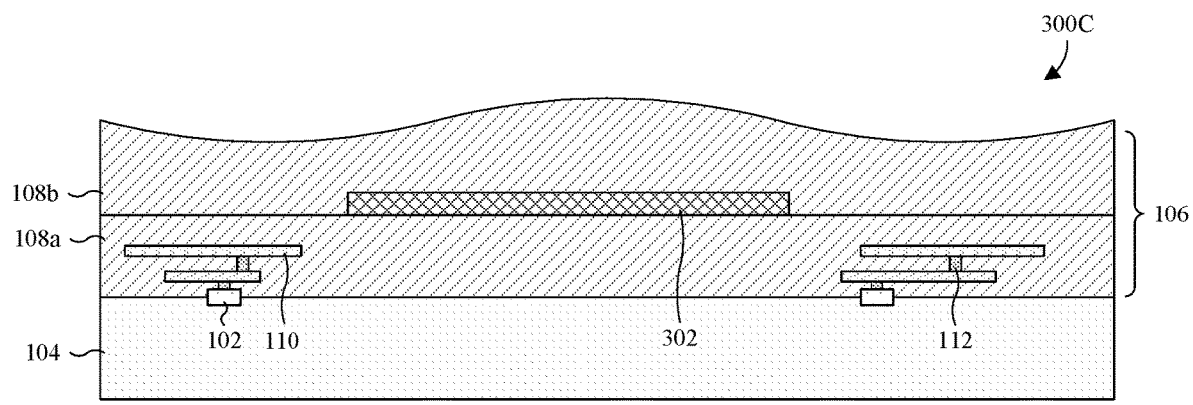

As illustrated by the cross-sectional view 300C of FIG. 3C, a second BEOL dielectric region 108b of the BEOL interconnect structure 106 is formed (e.g., deposited or grown) over the sacrificial layer 302 and the first BEOL dielectric region 108a. In some embodiments, the second BEOL dielectric region 108b includes one or more additional wiring layers (not shown) and/or one or more via layers (not shown) alternatingly stacked within the second BEOL dielectric region 108b, as within the first BEOL dielectric region 108a.

Figure 3D:
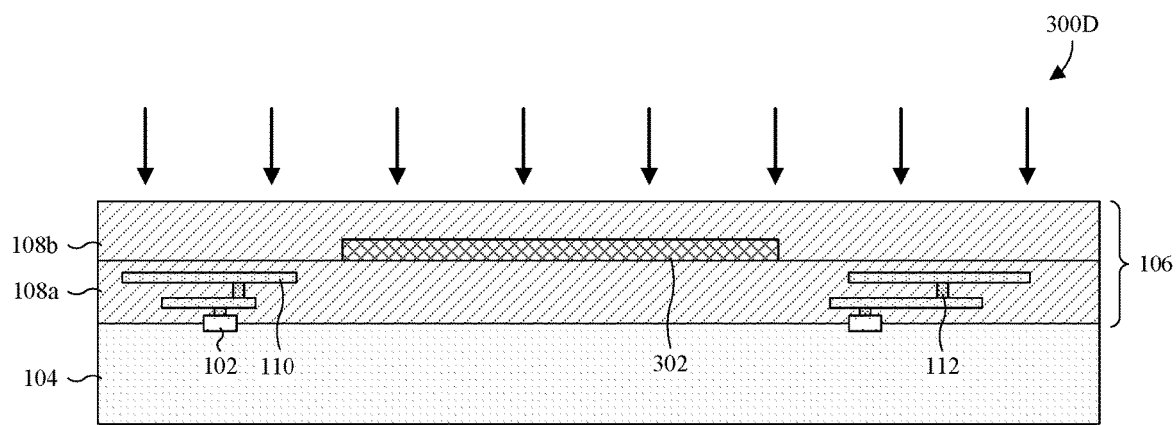

As illustrated by the cross-sectional view 300D of FIG. 3D, an upper surface of the second BEOL dielectric region 108b is planarized so that the second BEOL dielectric region 108b is substantially flat or planar. Further, the planarization may, for example, be performed by a CMP.

Figure 3E:
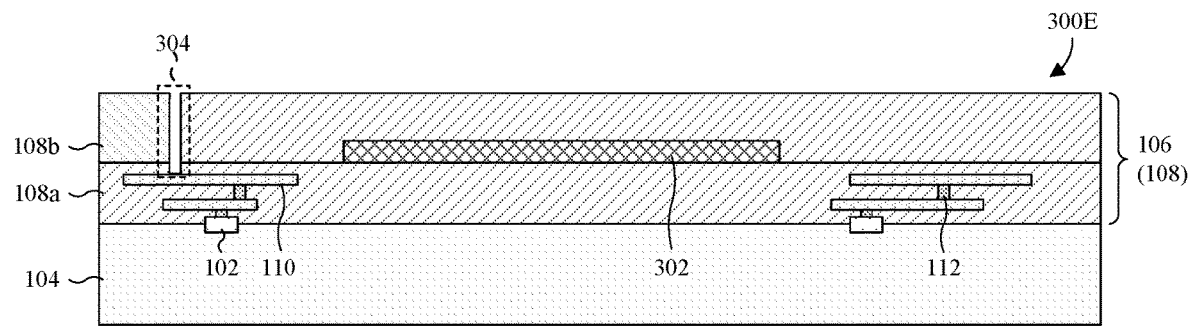

As illustrated by the cross-sectional view 300E of FIG. 3E, a first etch is performed into a BEOL dielectric region 108, comprising the first and second BEOL dielectric regions 108a, 108b, to form one or more inter-device opening(s) 304. In one embodiment, the inter-device opening(s) 304 extend from an upper surface of the second BEOL dielectric region 108b, through the second BEOL dielectric region 108b, to at least one wiring layer in the first BEOL dielectric region 108a. In some embodiments, the process for performing the first etch comprises forming and patterning a photoresist layer over second BEOL dielectric region 108b, applying an etchant to second BEOL dielectric region 108b with the photoresist layer in place, and removing the photoresist layer.

Figure 3F:
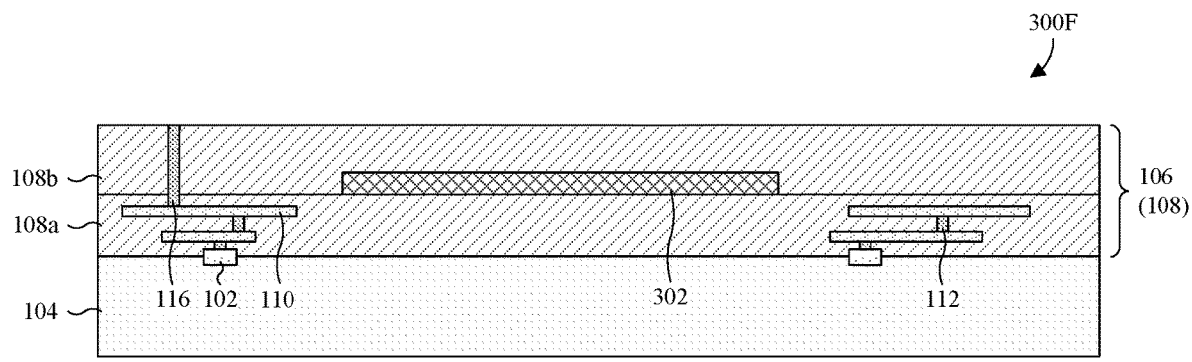

As illustrated by the cross-sectional view 300F of FIG. 3F, one or more inter-device vias 116 are respectively formed in the inter-device opening(s) 304. For example, a conductive layer may be deposited or grown in the inter-device opening(s) 304, and planarization (e.g., a CMP) may be performed to coplanarize upper surfaces respectively of the conductive layer and the second BEOL dielectric region 108b. Like the wiring layer(s) 110 and via layer(s) 112, the inter-device via(s) 116 may also be, for example, copper, aluminum copper, tungsten, some other metal or conductive material, a combination of the foregoing, or the like.

Figure 3G:
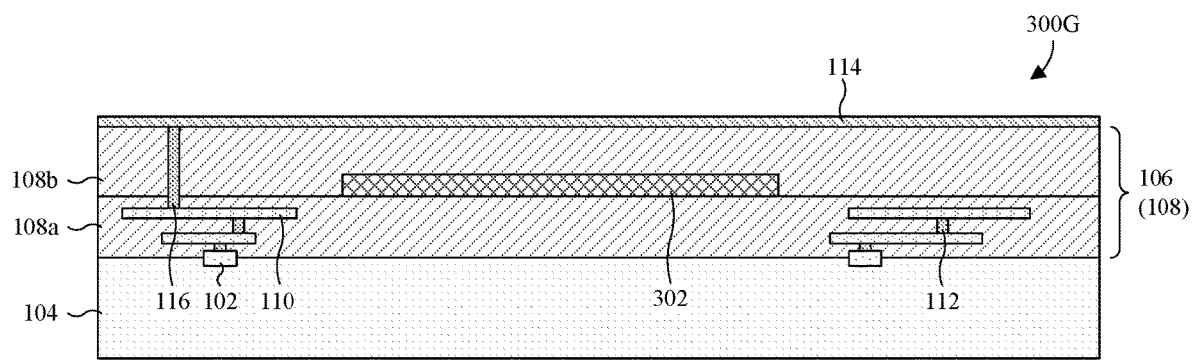

As illustrated by the cross-sectional view 300G of FIG. 3G, an electrode layer 114 is formed (e.g., deposited or grown) over the BEOL interconnect structure 106. The electrode layer 114 may be, for example, copper, aluminum copper, tungsten, some other metal or conductive material, a combination of the foregoing, or the like.

Figure 3H:
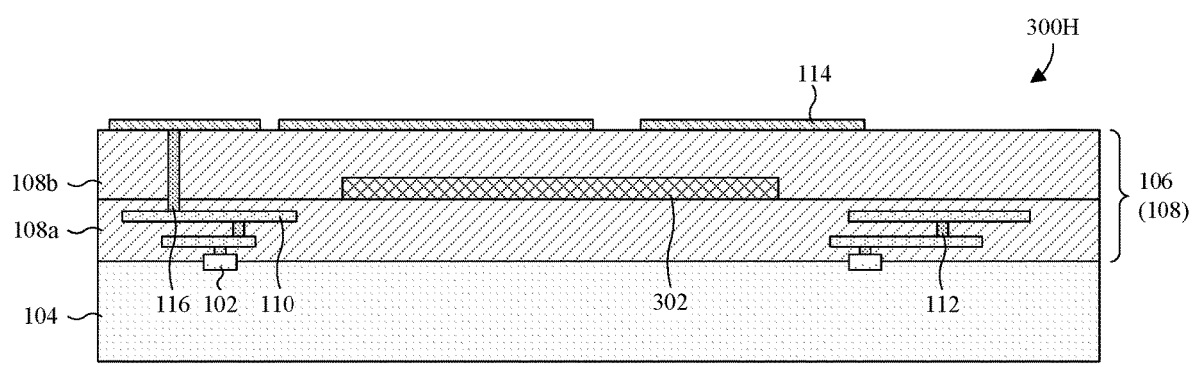

As illustrated by the cross-sectional view 300H of FIG. 3H, a second etch is performed into the electrode layer 114 to pattern the electrode layer 114. In some embodiments, the process for performing the second etch comprises forming and patterning a photoresist layer over the electrode layer 114, applying an etchant to the electrode layer 114 with the photoresist layer in place, and removing the photoresist layer.

Figure 3I:
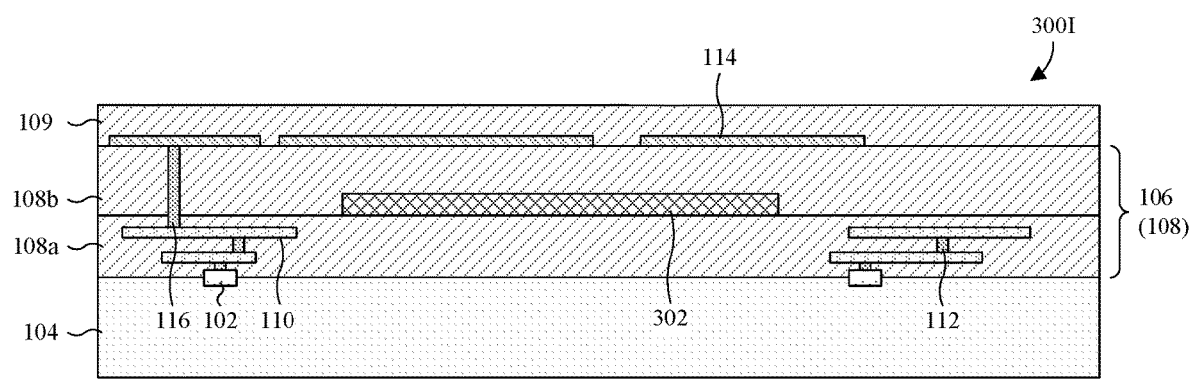

As illustrated by the cross-sectional view 300I of FIG. 3I, a MEMS dielectric region 109 is formed (e.g., deposited or grown) over the electrode layer 114. As discussed with regard to FIG. 2A, the MEMS dielectric region 109 and the electrode layer 114 collectively define a MEMS structure on the planar upper surface of the BEOL interconnect structure 106. In some embodiments, an upper surface of the MEMS dielectric region 109 may, for example, be planarized so that the upper surface of the MEMS dielectric region 109 is substantially flat or planar. Further, the planarization may, for example, be performed by a CMP.

Figure 3J:
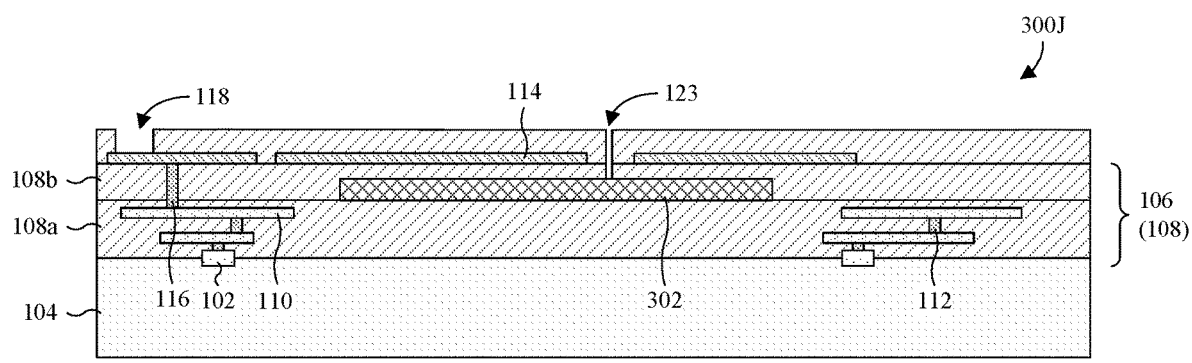

As illustrated by the cross-sectional view 300J of FIG. 3J, a third etch is performed to form an electrode opening 118. In some embodiments, the electrode opening 118 is formed in the MEMS dielectric region 109, and exposes a portion of the electrode layer 114. For example, a bottom surface of the electrode opening 118 may be defined by the electrode layer 114.

Also illustrated by the cross-sectional view 300J of FIG. 3J, a fourth etch (e.g., release etch) is performed to form a release opening 123. The release opening 123 extends through the MEMS dielectric region 109 and the second BEOL dielectric region 108b to expose the sacrificial layer 302.

Figure 3K:
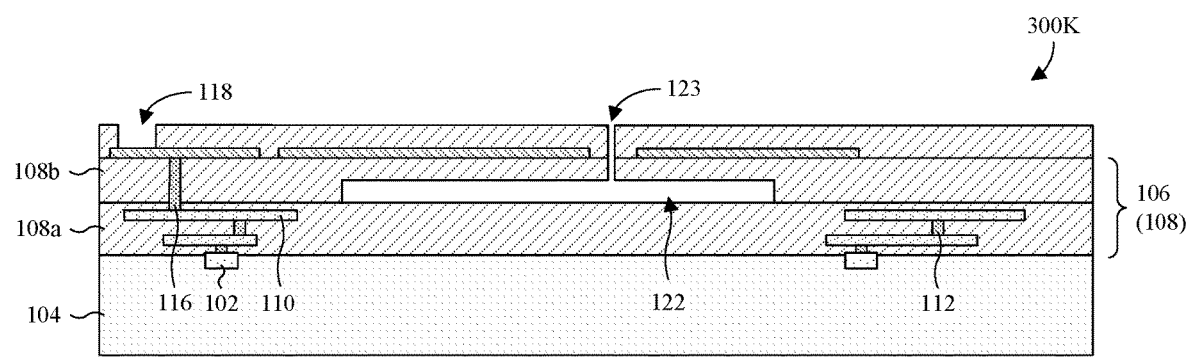

As illustrated by the cross-sectional view 300K of FIG. 3K, a fifth etch is performed into the sacrificial layer 302, through the release opening 123, to remove the sacrificial layer 302 and to form a cavity 122 in place of the sacrificial layer 302. In some embodiments, the fifth etch is performed by applying an etchant to the sacrificial layer 302 through the release opening 123. In some embodiments, the etchant for the fifth etch is selected based, at least in part, on the material of the sacrificial layer 302. For example, supposing that the sacrificial layer 302 is a-C, the fifth etch may be performed using a dry oxygen ($O2$) etchant. As another example, supposing the sacrificial layer 302 is a-Si or W, the fifth etch may be performed using a dry fluoric etchant, such as sulfur hexafluoride ($SF_6$) gas and/or xenon difluoride ($XeF_2$) gas. The etchant may also be a wet etchant. For example, hydrogen peroxide ($H_2O_2$) may be used in various embodiments in which the sacrificial layer 302 is TiW, W, or Ge. Phosphoric acid ($H_3SO_4$), nitric acid ($H_2NO_3$), and/or acetic acid ($CH_3OOH$) may be used in conjunction with water ($H_2O$) in various embodiments in which the sacrificial layer 302 is AlCu.

With reference to FIGS. 4A-4L, a series of cross-sectional views 400A-400L of some embodiments of a method for manufacturing the IC of FIG. 2B is illustrated.

Figure 4A:
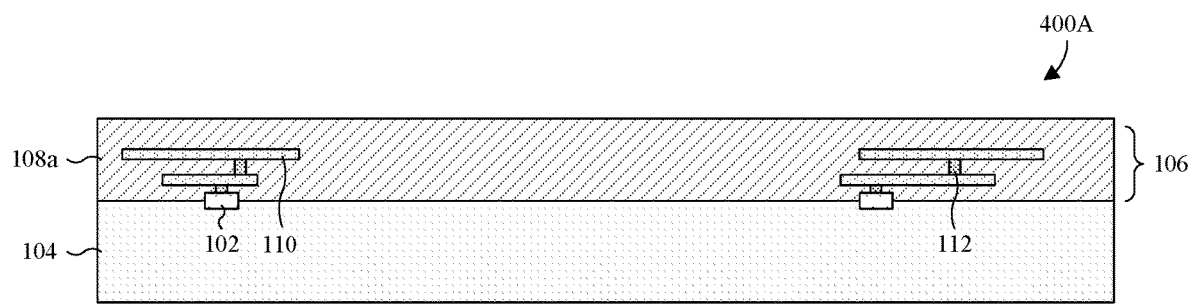
FIGS. 4A-4L illustrate a series of cross-sectional views of some embodiments of a method for manufacturing the IC of FIG. 2B.

As illustrated by the cross-sectional view 400A of FIG. 4A, a BEOL interconnect structure 106 is arranged over a semiconductor substrate 104 having CMOS devices 102. The BEOL interconnect structure 106 comprises a first BEOL dielectric region 108a, as well as one or more wiring layers 110 and one or more via layers 112 alternatingly stacked within the first BEOL dielectric region 108a.

Figure 4B:
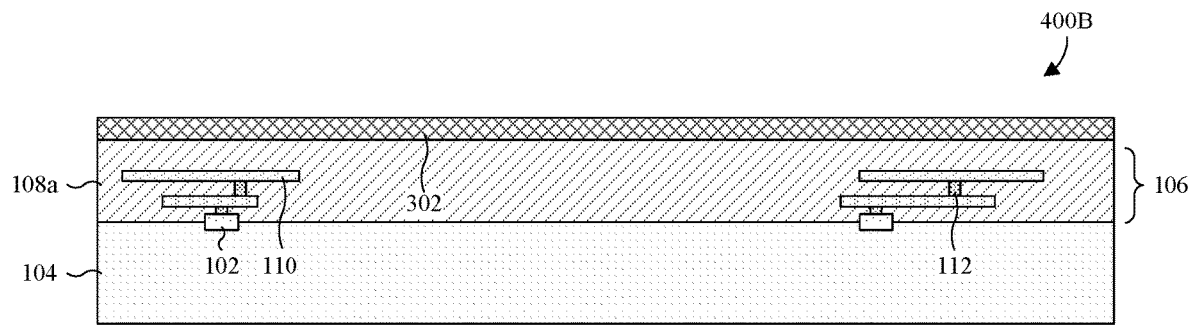

As illustrated by the cross-sectional view 400B of FIG. 4B, a sacrificial layer 302 is formed (e.g., deposited or grown) over the BEOL interconnect structure 106. In some embodiments, the sacrificial layer 302 comprises an amorphous metalloid, amorphous carbon (a-C), amorphous silicon (a-Si), a combination of the foregoing, or the like. In other embodiments, the sacrificial layer 302 may be titanium tungsten (TiW), tungsten (W), germanium (Ge), aluminum copper (AlCu), a combination of the foregoing, or the like. The material of the sacrificial layer 302 may, for example, be selected so that the deposition or growth process can be performed at a process temperature of less than 450 degrees Celsius in order to avoid damage to the BEOL interconnect structure.

Figure 4C:
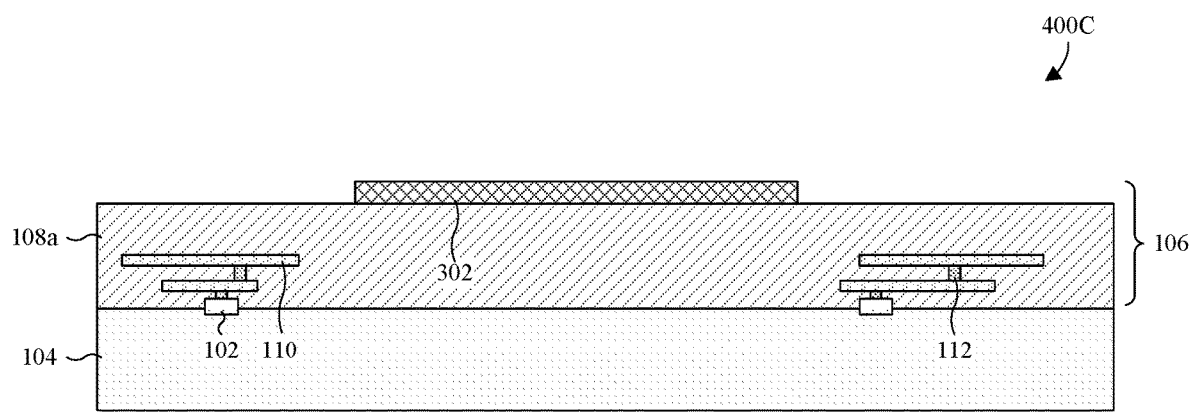

As illustrated by the cross-sectional view 400C of FIG. 4C, a first etch is performed into the sacrificial layer 302 to pattern the sacrificial layer 302. In some embodiments, the process for performing the first etch comprises forming and patterning a photoresist layer over the sacrificial layer 302, applying an etchant to the sacrificial layer 302 with the photoresist layer in place, and removing the photoresist layer. The sacrificial layer 302 may be patterned, for example, to have a line or ring shape.

Figure 4D:
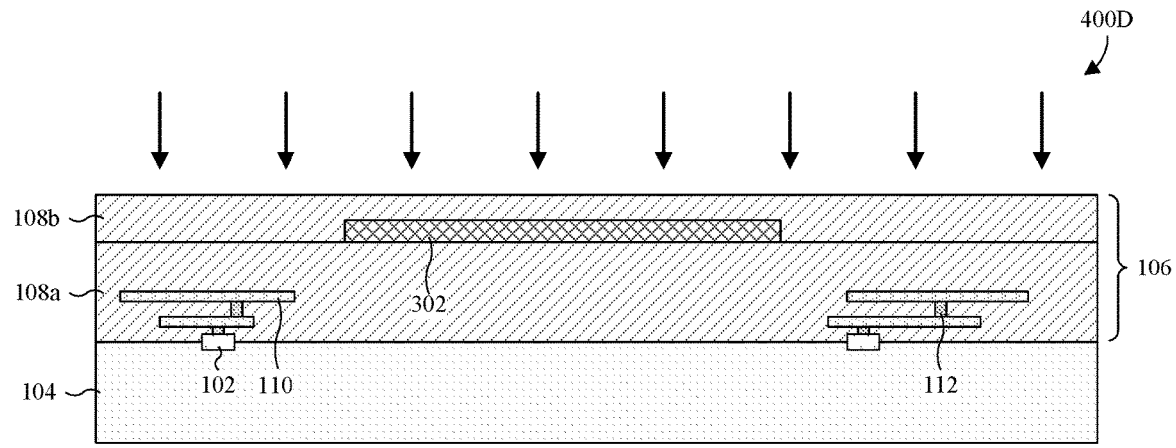

As illustrated by the cross-sectional view 400D of FIG. 4D, a second BEOL dielectric region 108b of the BEOL interconnect structure 106 is formed (e.g., deposited or grown) over the sacrificial layer 302 and the first BEOL dielectric region 108a. In some embodiments, the process for forming the second BEOL dielectric region 108b comprises depositing or growing the second BEOL dielectric region 108b, and subsequently performing a planarization into an upper or top surface of the second BEOL dielectric region 108b such that the upper or top surface of the second BEOL dielectric region 108b is flat. The second BEOL dielectric region 108b may be deposited or grown by, for example, thermal oxidation, vapor deposition, sputtering, or some other deposition or growth process.

Figure 4E:
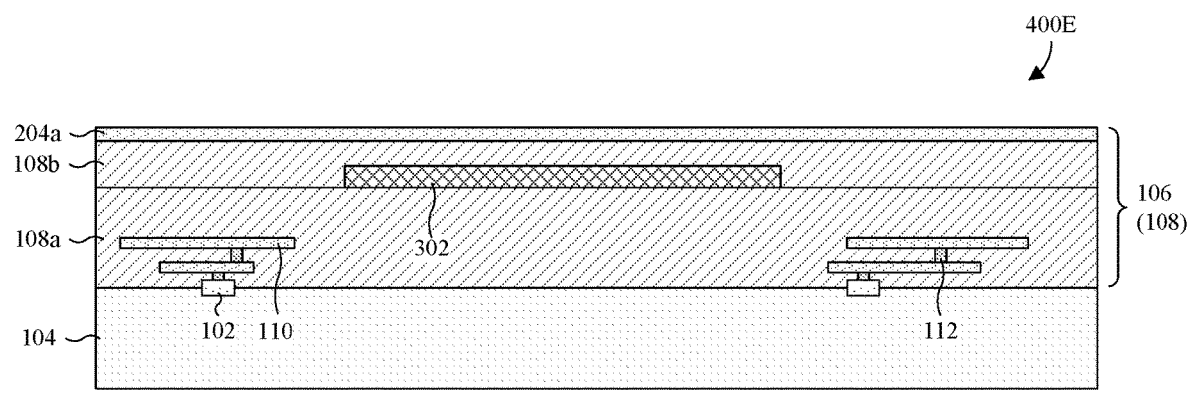

As illustrated by the cross-sectional view 400E of FIG. 4E, a first piezoelectric layer 204a is deposited over a BEOL dielectric region 108 of the BEOL interconnect structure 106, comprising the first and second BEOL dielectric regions 108a, 108b. In some embodiments, the first piezoelectric layer 204a is formed of aluminum nitride, zinc oxide, lead zirconate titanate, a combination of the foregoing, or the like. Further, in some embodiments, the first piezoelectric layer 204a is formed by sputtering or vapor deposition. In some embodiment, the first piezoelectric layer 204a may be a seed layer used to grow a subsequently formed piezoelectric layer.

Figure 4F:
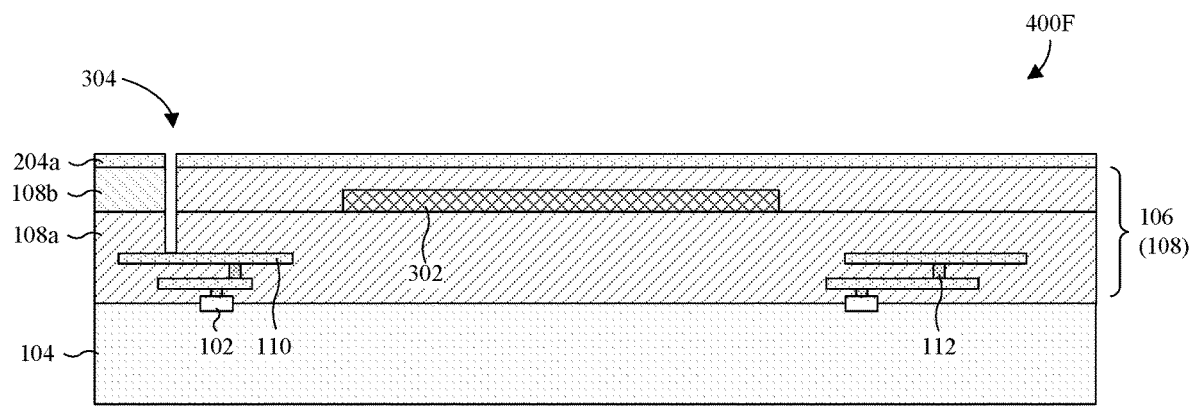

As illustrated by the cross-sectional view 400F of FIG. 4F, a second etch is performed into the first piezoelectric layer 204a and the BEOL dielectric region 108 to form one or more inter-device openings 304. In some embodiment, the inter-device opening(s) 304 extend from an upper surface of the first piezoelectric layer 204a, through the first piezoelectric layer 204a and the second BEOL dielectric region 108b, to a top wiring layer in the first BEOL dielectric region 108a, thereby exposing the top wiring layer. In some embodiments, the process for performing the second etch comprises forming and patterning a photoresist layer over the first piezoelectric layer 204a, applying an etchant to first piezoelectric layer 204a and BEOL dielectric region 108 with the photoresist layer in place, and removing the photoresist layer.

Figure 4G:
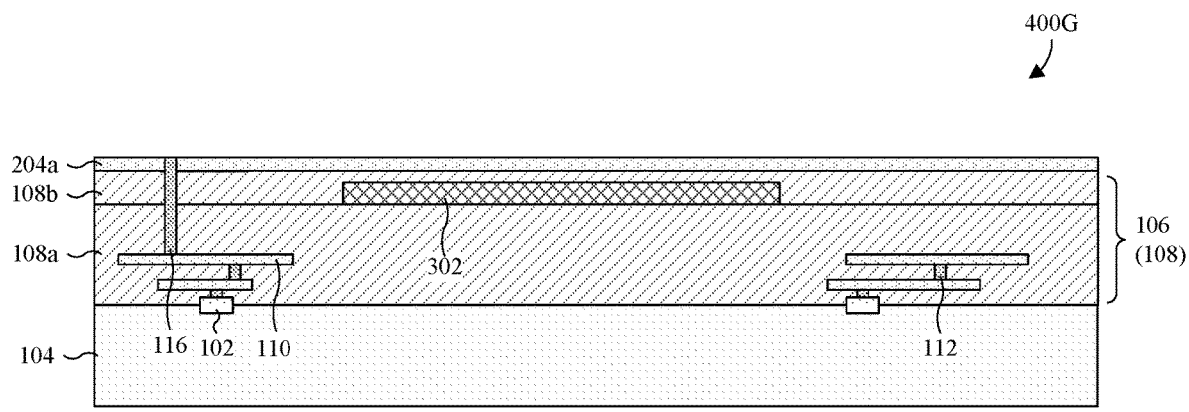

As illustrated by the cross-sectional view 400G of FIG. 4G, one or more inter-device vias 116 are respectively formed in the inter-device opening(s) 304. Like the wiring layer(s) 110 and via layer(s) 112, the inter-device via(s) 116 may be, for example, copper, aluminum copper, tungsten, some other metal or conductive material, a combination of the foregoing, or the like.

Figure 4H:
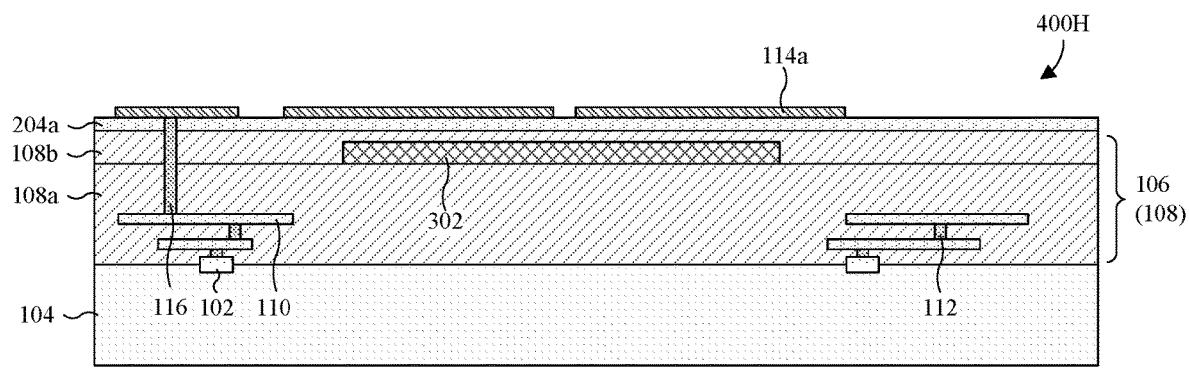

As illustrated by the cross-sectional view 400H of FIG. 4H, a first electrode layer 114a is formed over the first piezoelectric layer 204a. Further, the first electrode layer 114a is formed electrically coupled to the inter-device via(s) 116, and further electrically coupled to the top wiring layer in the first BEOL dielectric region 108a by the inter-device via(s) 116. The first electrode layer 114a may, for example, be formed of molybdenum, aluminum, gold, or platinum, or the like. Further, the first electrode layer 114a may, for example, be formed by a dual-damascene-like process, a single damascene-like process, or deposition and patterning process.

Figure 4I:
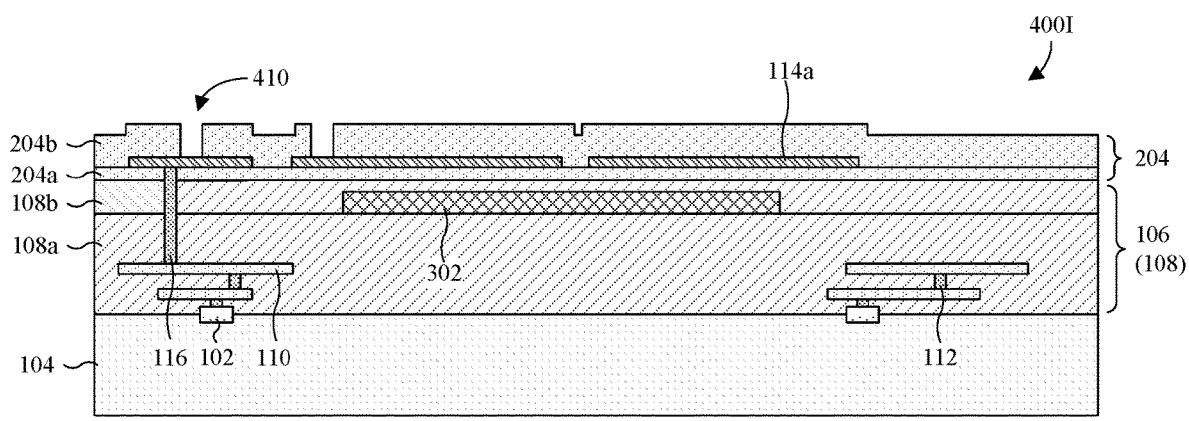

As illustrated by the cross-sectional view 400I of FIG. 4I, a second piezoelectric layer 204b is formed over the first electrode layer 114a. The second piezoelectric layer 204b may, for example, be the same material as the first piezoelectric layer 204a, and/or may be, for example, formed patterned. For example, in one embodiment, a third etch is performed into the second piezoelectric layer 204b to form one or more through-via openings 410 exposing the first electrode layer 114a. In some embodiments, the process for performing the third etch comprises forming and patterning a photoresist layer over the second piezoelectric layer 204b, applying an etchant to the second piezoelectric layer 204b with the photoresist layer in place, and removing the photoresist layer.

Figure 4J:
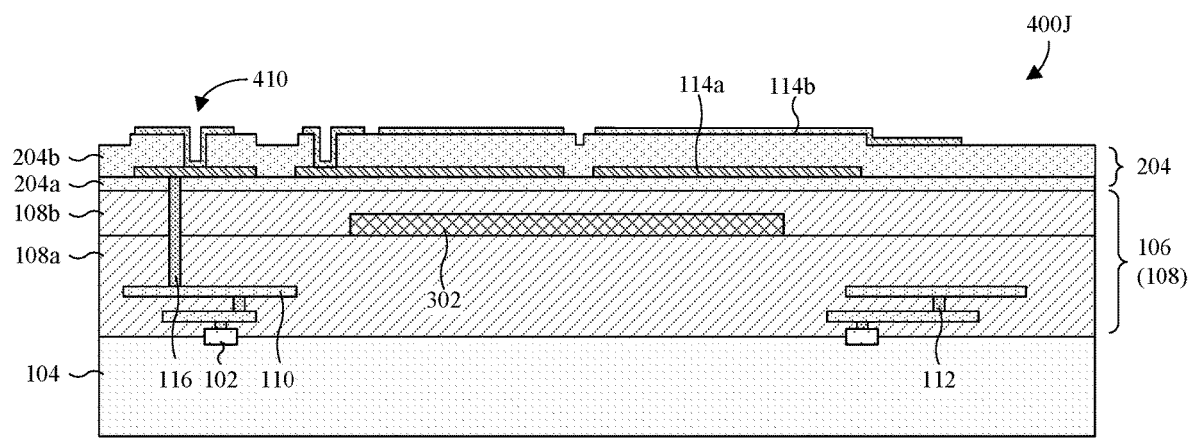

As illustrated by the cross-sectional view 400J of FIG. 4J, a second electrode layer 114b is formed over the second piezoelectric layer 204b. As discussed with regard to FIG. 2B, the first and second electrode layers 114a, 114b and the first and second piezoelectric layers 204a, 204b form a MEMS structure. Further, the second electrode layer 114b is formed lining the through-via opening(s) 410, such that the second electrode layer 114b is electrically coupled to the first electrode layer 114a. The second electrode layer 114b may, for example, be formed conformally lining the through-via opening(s) 410, and/or may, for example, be formed of aluminum copper, molybdenum, aluminum, gold, or a combination of the foregoing.

In some embodiments, the process for forming the second electrode layer 114b comprises depositing or growing the second electrode layer 114b, and subsequently patterning the second electrode layer 114b. The second electrode layer 114b may, for example, be deposited or grown by, for example, sputtering or vapor deposition. Further, the second electrode layer 114b may, for example, be patterned using photolithography.

Figure 4K:
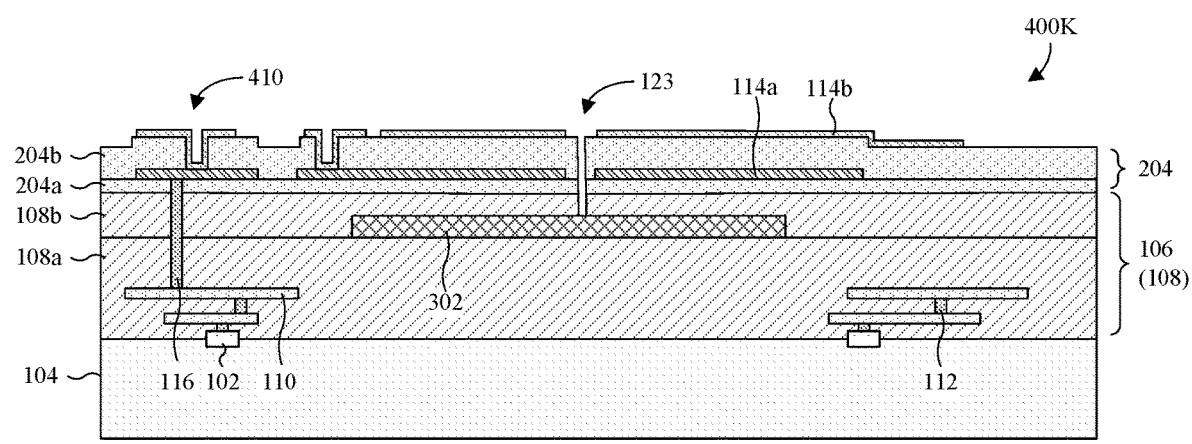

As illustrated by the cross-sectional view 400K of FIG. 4K, a fourth etch is performed through the first and second piezoelectric layers 204a, 204b and the second BEOL dielectric region 108b to form a release opening 123 exposing the sacrificial layer 302. The process for performing the fourth etch may comprise, for example, forming and patterning a photoresist layer over the second piezoelectric layer 204b, applying an etchant to the first and second piezoelectric layers 204a, 204b and the second BEOL dielectric region 108b with the photoresist layer in place, and removing the photoresist layer.

Figure 4L:
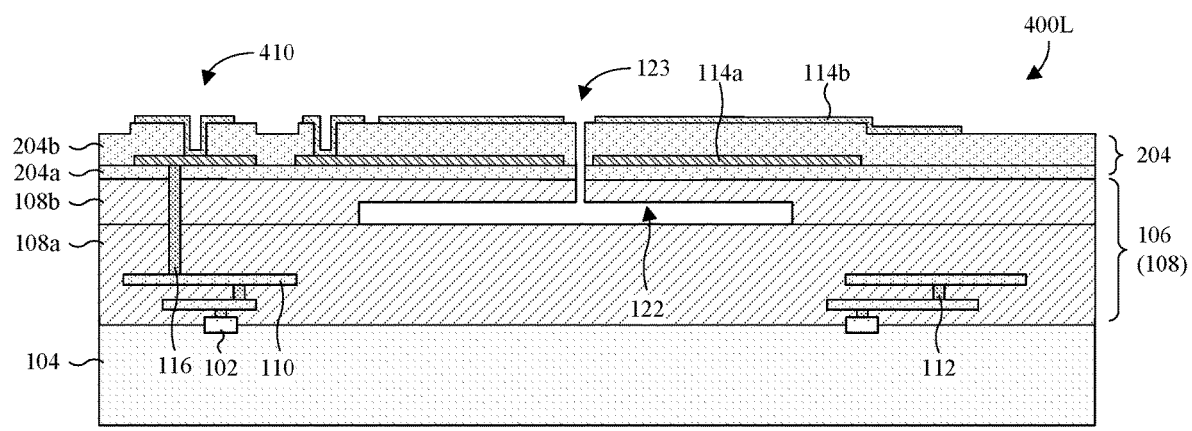

As illustrated by the cross-sectional view 400L of FIG. 4L, a fifth etch (e.g., cavity etch) is performed into the sacrificial layer 302, through the release opening 123, to remove the sacrificial layer 302 and to form a cavity 122 in place of the sacrificial layer 302. In some embodiments, the fifth etch is performed by applying an etchant to the sacrificial layer 302 through the release opening 123. As described above, in some embodiments, the etchant for the fifth etch is selected based, at least in part, on the material of the sacrificial layer 302.

Because the second BEOL dielectric region 108b is formed over the sacrificial layer 302, the resulting IC has a cavity 122 that is bordered by the dielectric region on all sides. Further, because a planarization is performed into an upper or top surface of the second BEOL dielectric region 108b, the MEMS structure is formed on a substantially planar or flat surface and does not suffer a step up and has good anchor support and rigidity.

With reference to FIGS. 5A-5L, a series of cross-sectional views 500A-500L of some embodiments of a method for manufacturing the IC of FIG. 2C is illustrated.

Figure 5A:
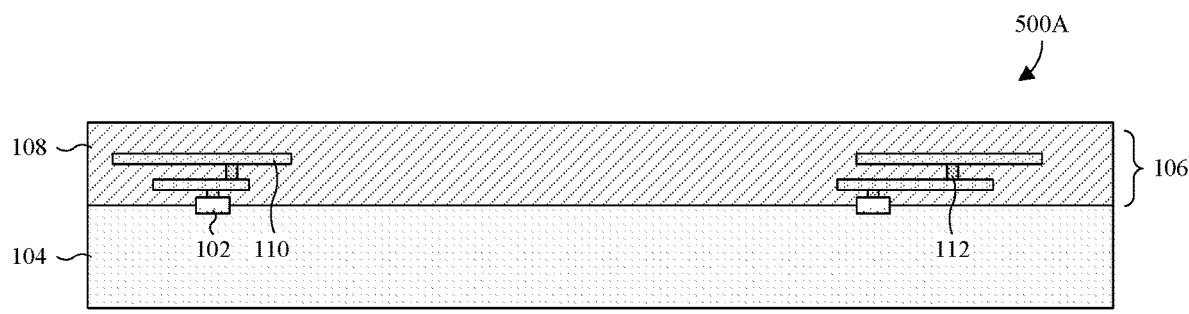
FIGS. 5A-5L illustrate a series of cross-sectional views of some embodiments of a method for manufacturing the IC of FIG. 2C.

As illustrated by cross-sectional view 500A of FIG. 5A, a BEOL interconnect structure 106 is arranged over a semiconductor substrate 104 having CMOS devices 102. The BEOL interconnect structure 106 comprises a BEOL dielectric region 108, as well as one or more wiring layer(s) 110 and one or more via layer(s) 112 alternatingly stacked within the BEOL dielectric region 108.

Figure 5B:
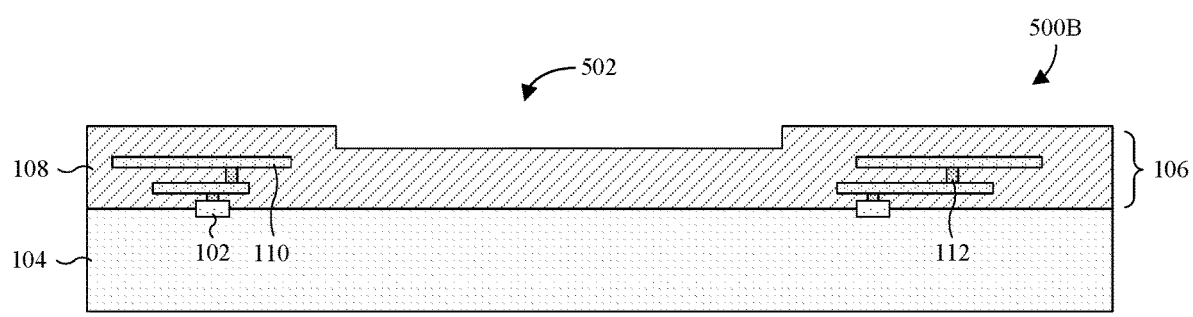

As illustrated by the cross-sectional view 500B of FIG. 5B, a first etch is performed to form a trench 502 in the BEOL dielectric region 108. The trench 502 may, for example, have a line or ring shape. In some embodiments, the process for performing the first etch comprises forming and patterning a photoresist layer over the BEOL dielectric region 108, applying an etchant to the BEOL dielectric region 108 with the photoresist layer in place, and removing the photoresist layer.

Figure 5C:
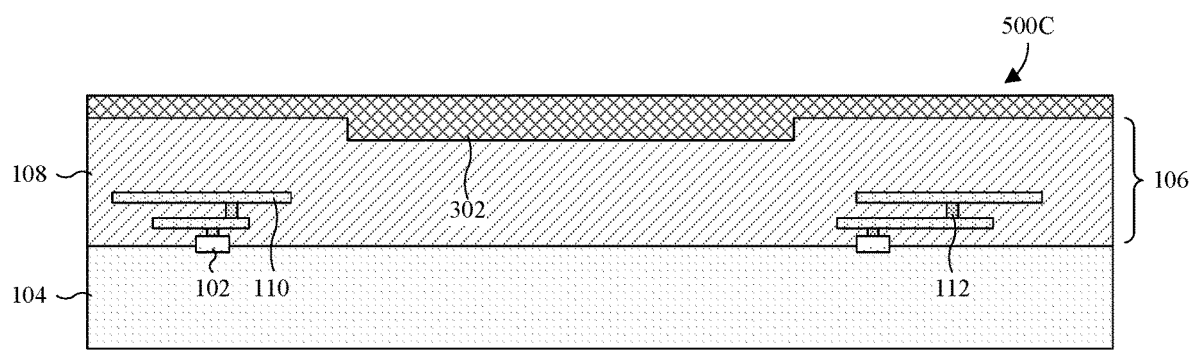

As illustrated by the cross-sectional view 500C of FIG. 5C, a sacrificial layer 302 is formed (e.g., deposited or grown) over the BEOL interconnect structure 106 and filling the trench 502. In some embodiments, the sacrificial layer 302 is an amorphous metalloid, amorphous carbon (a-C), amorphous silicon (a-Si), a combination of the foregoing, or the like. In other embodiments, the sacrificial layer 302 is titanium tungsten (TiW), tungsten (W), germanium (Ge), aluminum copper (AlCu), a combination of the foregoing, or the like. The material of the sacrificial layer 302 may, for example, be selected so that the deposition or growth process can be performed at a process temperature of less than 450 degrees Celsius.

Figure 5D:
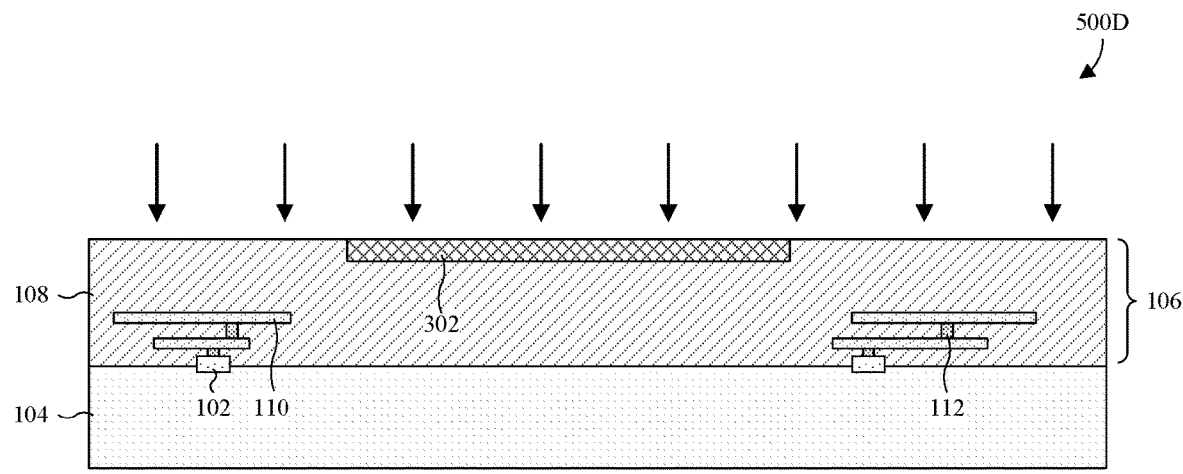

As illustrated by the cross-sectional view 500D of FIG. 5D, the BEOL dielectric region 108 and the sacrificial layer 302 are planarized, such that upper or top surfaces respectively of the BEOL dielectric region 108 and the sacrificial layer 302 are coplanar.

Figure 5E:
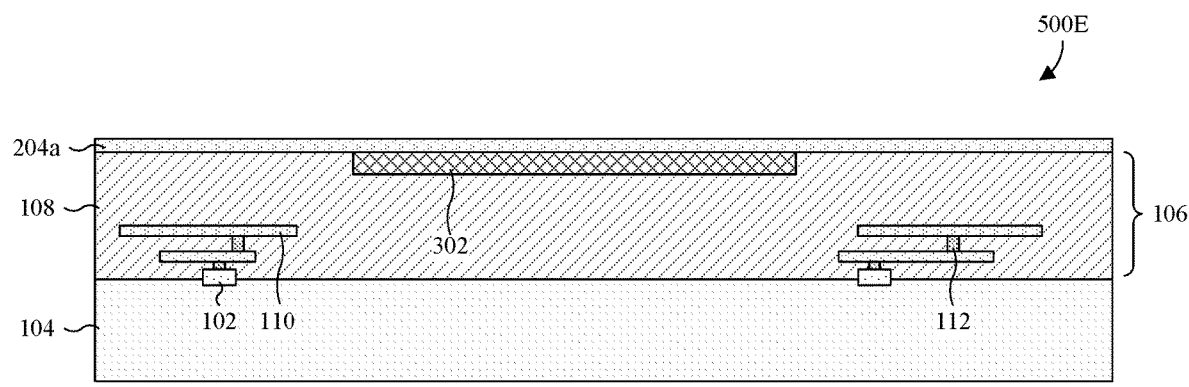

As illustrated by the cross-sectional view 500E of FIG. 5E, a first piezoelectric layer 204a is formed (e.g., deposited or grown) over the BEOL dielectric region 108. In some embodiments, the first piezoelectric layer 204a is formed of aluminum nitride, zinc oxide, lead zirconate titanate, or the like. Further, in some embodiments, the first piezoelectric layer 204a is formed by sputtering or vapor deposition. In some embodiment, the first piezoelectric layer 204a may be a seed layer used to grow a subsequently formed piezoelectric layer.

Figure 5F:
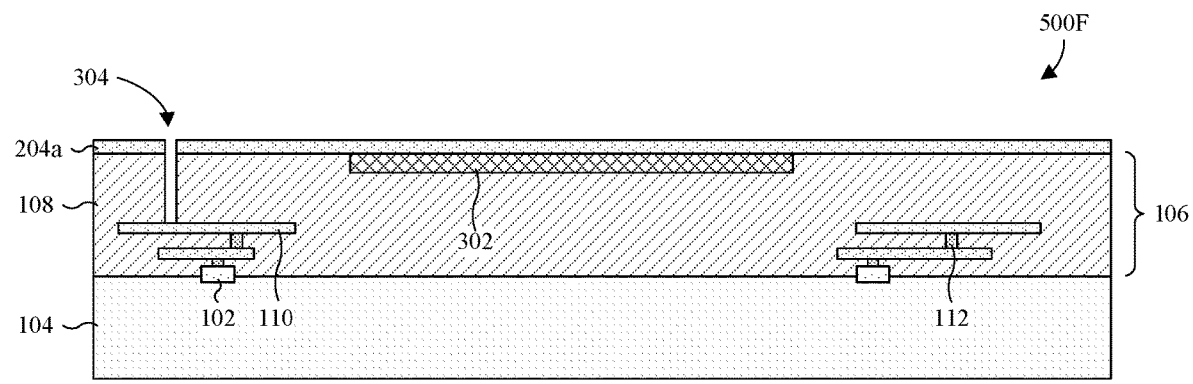

As illustrated by the cross-sectional view 500F of FIG. 5F, a second etch is performed into the first piezoelectric layer 204a and the BEOL dielectric region 108 to form one or more inter-device openings 304. In some embodiments, the inter-device opening(s) 304 extend from an upper surface of the first piezoelectric layer 204a, through the first piezoelectric layer 204a, to a top wiring layer in the BEOL dielectric region 108, thereby exposing the top wiring layer. In some embodiments, the process for performing the second etch comprises forming and patterning a photoresist layer over the first piezoelectric layer 204a, applying an etchant to first piezoelectric layer 204a and the BEOL dielectric region 108 with the photoresist layer in place, and removing the photoresist layer.

Figure 5G:
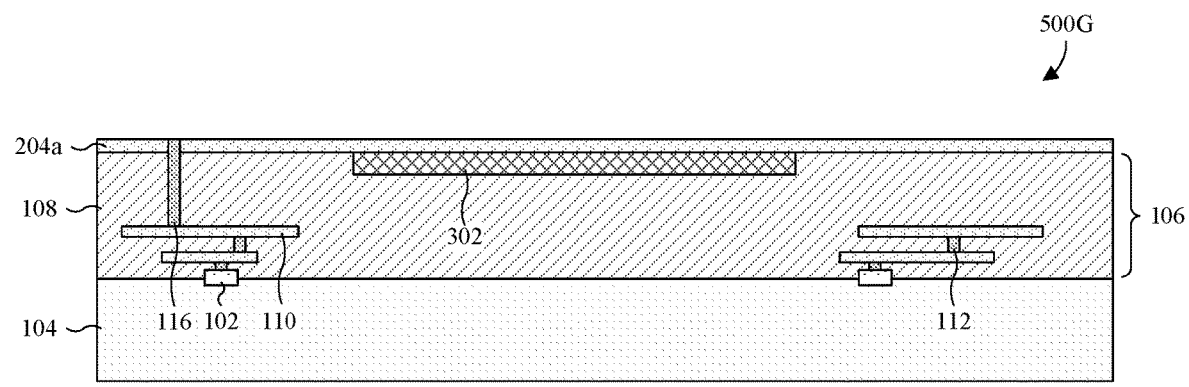

As illustrated by the cross-sectional view 500G of FIG. 5G, one or more inter-device via(s) 116 are respectively formed in the inter-device opening(s) 304. Like the wiring layer(s) 110 and via layer(s) 112, the inter-device via(s) 116 may also be, for example, copper, aluminum copper, tungsten, some other metal or conductive material, a combination of the foregoing, or the like.

Figure 5H:
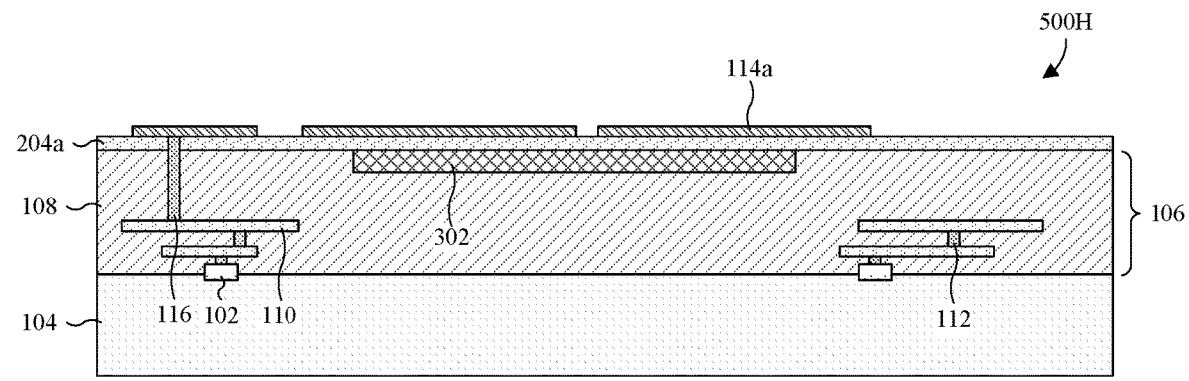

As illustrated by the cross-sectional view 500H of FIG. 5H, a first electrode layer 114a is formed over the first piezoelectric layer 204a. Further, the first electrode layer 114a is formed electrically coupled to the inter-device via(s) 116, and further electrically coupled to the top wiring layer by the inter-device via(s) 116. The first electrode layer 114a may, for example, be formed of molybdenum, aluminum, gold, platinum, or the like. Further, the first electrode layer 114a may, for example, be formed by a dual-damascene-like process, a single damascene-like process or deposition and patterning process.

Figure 5I:
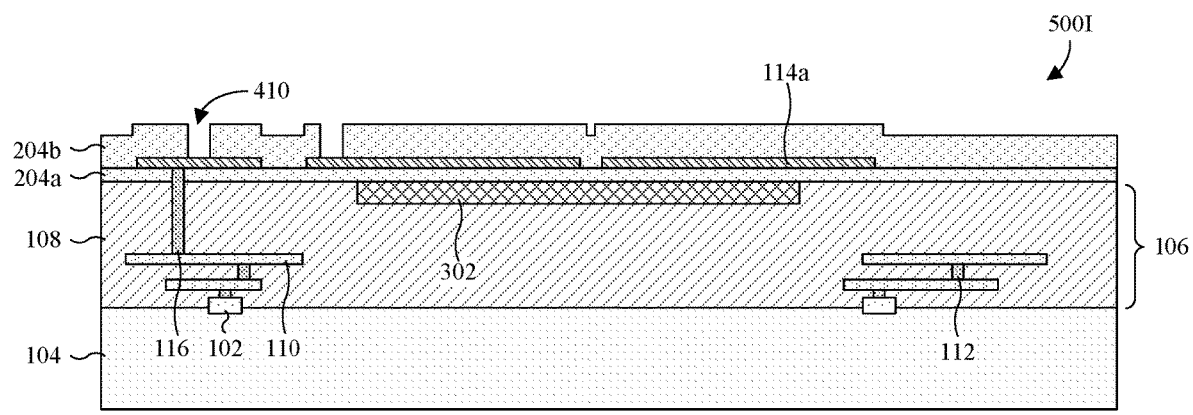

As illustrated by the cross-sectional view 500I of FIG. 5I, a second piezoelectric layer 204b is formed over the first electrode layer 114a. The second piezoelectric layer 204b may, for example, be the same material as the first piezoelectric layer 204a, and/or may, for example, may be patterned. For example, in some embodiments, a third etch is performed through the second piezoelectric layer 204b to form one or more through-via openings 410 exposing the first electrode layer 114a. In some embodiments, the process for performing the third etch comprises forming and patterning a photoresist layer over the second piezoelectric layer 204b, applying an etchant to the second piezoelectric layer 204b with the photoresist layer in place, and removing the photoresist layer.

Figure 5J:
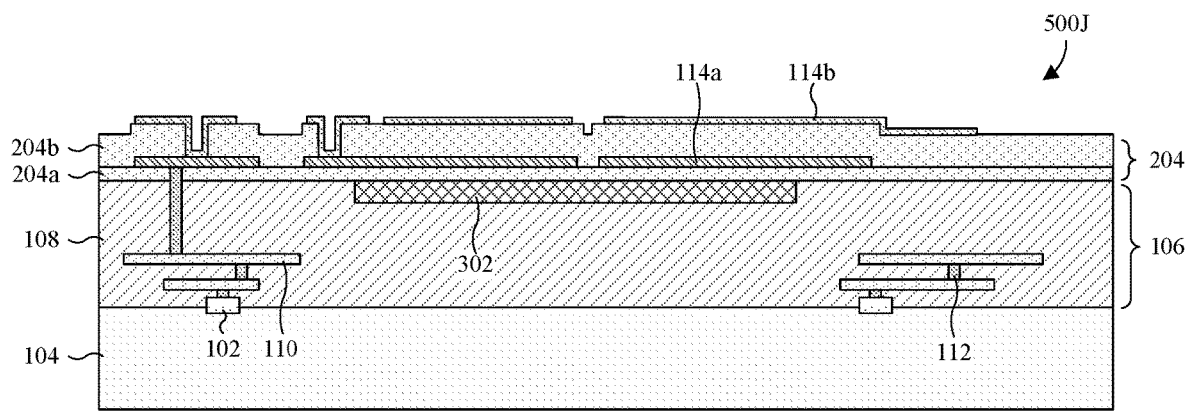

As illustrated by the cross-sectional view 500J of FIG. 5J, a second electrode layer 114b is formed over the second piezoelectric layer 204b. As discussed with regard to FIG. 2C, the first and second electrode layers 114a, 114b and the first and second piezoelectric layers 204a, 204b form a MEMS structure. Further, the second electrode layer 114b is formed lining the through-via opening(s) 410, such that the second electrode layer 114b is electrically coupled to the first electrode layer 114a. The second electrode layer 114b may, for example, be formed conformally lining the through-via opening(s) 410, and/or may, for example, be formed of aluminum copper, molybdenum, aluminum, or gold.

In some embodiments, the process for forming the second electrode layer 114b comprises depositing or growing the second electrode layer 114b, and subsequently patterning the second electrode layer 114b. The second electrode layer 114b may, for example, be deposited or grown by, for example, sputtering or vapor deposition. Further, the second electrode layer 114b may, for example, be patterned using photolithography.

Figure 5K:
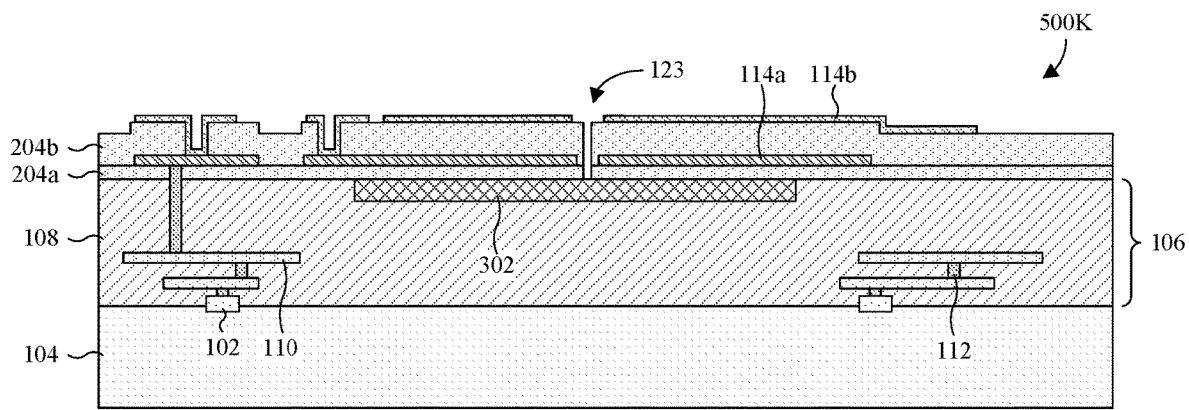

As illustrated by the cross-sectional view 500K of FIG. 5K, a fourth etch is performed through the first and second piezoelectric layers 204a, 204b to form a release opening 123 exposing the sacrificial layer 302.

Figure 5L:
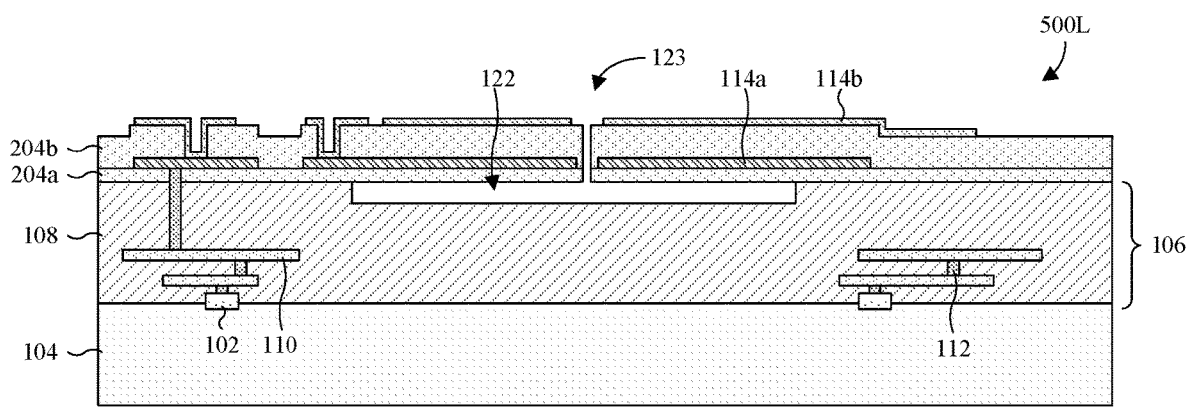

As illustrated by the cross-sectional view 500L of FIG. 5L, a fifth etch is performed into the sacrificial layer 302, through the release opening 123, to remove the sacrificial layer 302 and to form a cavity 122 in place of the sacrificial layer 302. In some embodiments, the fifth etch is performed by applying an etchant to the sacrificial layer 302 through the release opening 123. As described above, in some embodiments, the etchant for the fifth etch is selected based, at least in part, on the material of the sacrificial layer 302.

Because the sacrificial layer 302 is formed inset into the BEOL dielectric region 108, a bottom surface of the cavity 122 and sidewalls of the cavity 122 are defined by the BEOL dielectric region 108. Further, because a planarization is performed to coplanarize upper surfaces respectively of the sacrificial layer 302 and the BEOL dielectric region 108, the MEMS structure is formed on a substantially planar or flat surface and does not suffer a step up and has good anchor support and rigidity.

Figure 6:
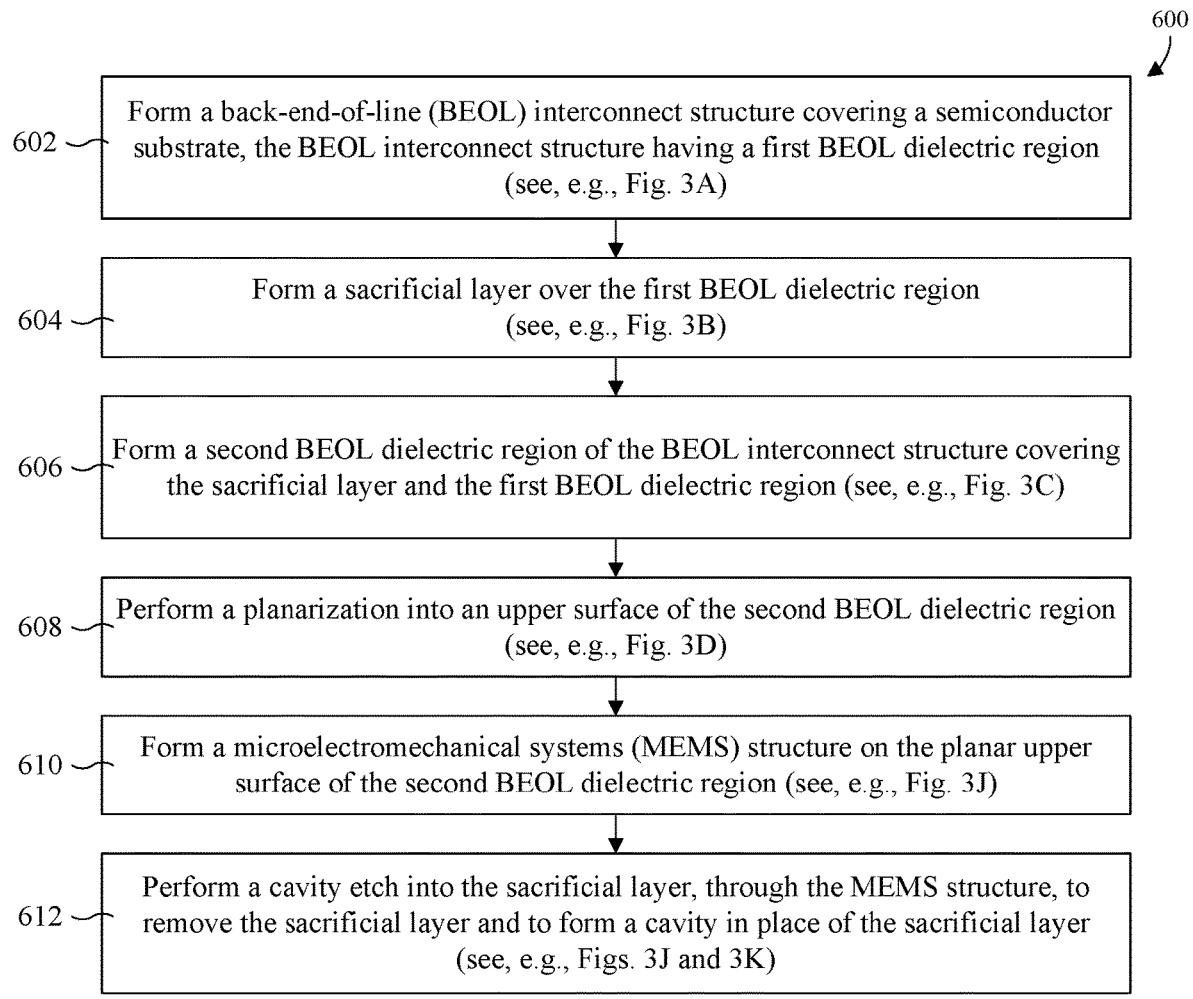
FIG. 6 illustrates a flowchart of some embodiments of the method of FIGS. 3A-3K.

With reference to FIG. 6, a flowchart 600 of some embodiments of the method of FIGS. 3A-3K is provided.

At 602, a back-end-of-line (BEOL) interconnect structure is formed covering a semiconductor substrate. The BEOL interconnect structure includes a first BEOL dielectric region. See, for example, FIG. 3A.

At 604, a sacrificial layer is formed over the first BEOL dielectric region. See, for example, FIG. 3B.

At 606, a second BEOL dielectric region of the BEOL interconnect structure is formed covering the sacrificial layer and the first BEOL dielectric region. See, for example, FIG. 3C.

At 608, an upper surface of the second BEOL dielectric region is planarized. See, for example, FIG. 3D.

At 610, a MEMS structure is formed on the planar upper surface of the second BEOL dielectric region. See, for example, FIG. 3J.

At 612, a cavity etch is performed into the sacrificial layer, through the MEMS structure, to remove the sacrificial layer and to form a cavity in place of the sacrificial layer. See, for example, FIGS. 3J and 3K.

Figure 7:
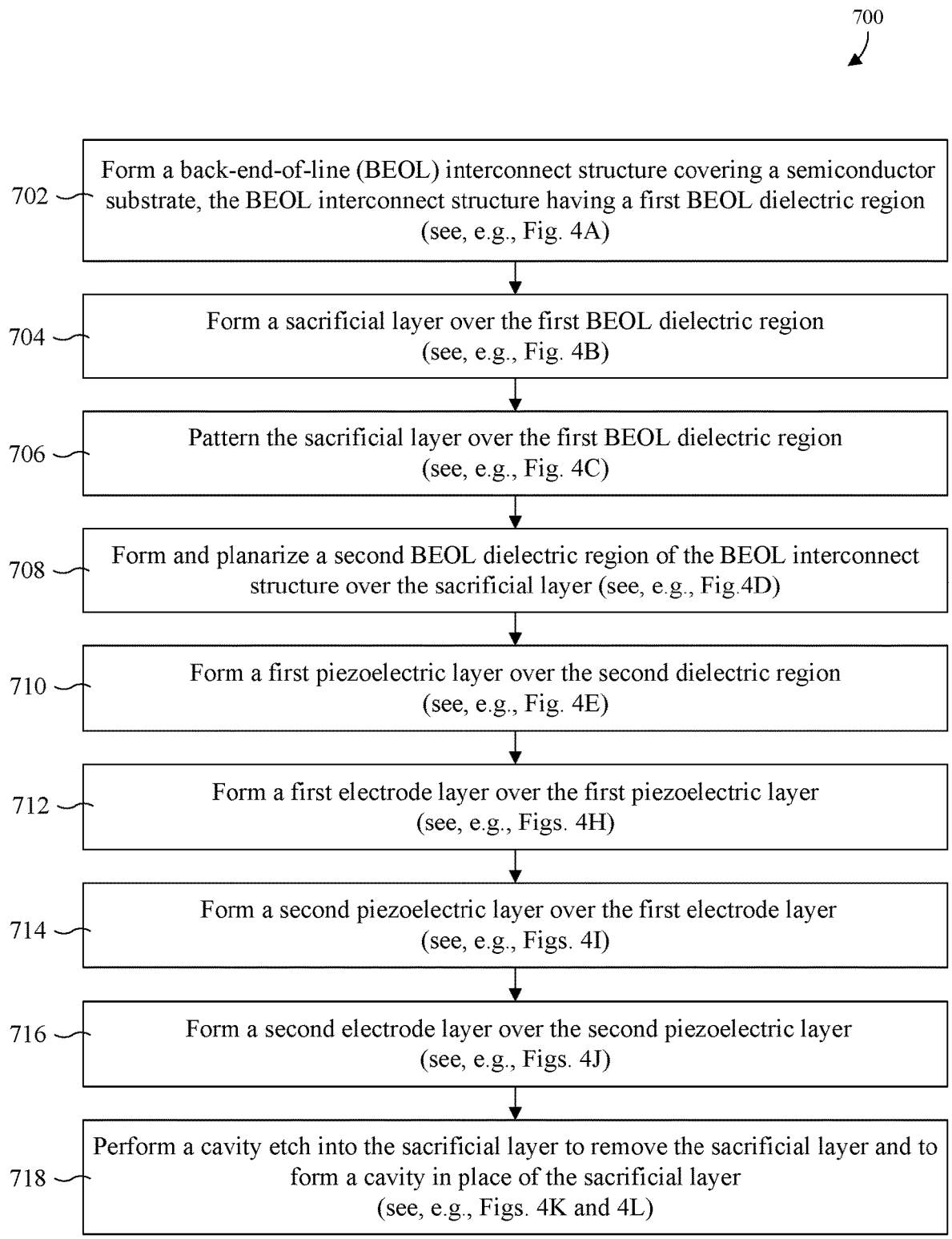
FIG. 7 illustrates a flowchart of some embodiments of the method of FIGS. 4A-4L.

With reference to FIG. 7, a flowchart 700 of some embodiments of the method of FIGS. 4A-4L is provided.

At 702, a BEOL interconnect structure is formed covering a semiconductor substrate. The BEOL interconnect structure includes one or more wiring layers stacked in a first BEOL dielectric region. See, for example, FIG. 4A.

At 704, a sacrificial layer is formed over the first BEOL dielectric layer. See, for example, FIG. 4B.

At 706, the sacrificial layer is patterned. See, for example, FIG. 4C.

At 708, a second BEOL dielectric region of the BEOL interconnect structure is formed covering the sacrificial layer. The second BEOL dielectric region is then planarized. See, for example, FIG. 4D.

At 710, a first piezoelectric layer is formed over the second BEOL dielectric region. See, for example, FIG. 4E.

At 712, a first electrode layer is formed over the first piezoelectric layer. See, for example, FIG. 4H.

At 714, a second piezoelectric layer is formed over the first electrode layer. See, for example, FIG. 4I.

At 716, a second electrode layer is layer is formed over the second piezoelectric layer. See, for example, FIG. 4J.

At 718, a cavity etch is performed to remove the sacrificial layer and to form a cavity in place of the sacrificial layer. See, for example, FIGS. 4K and 4L.

Figure 8:
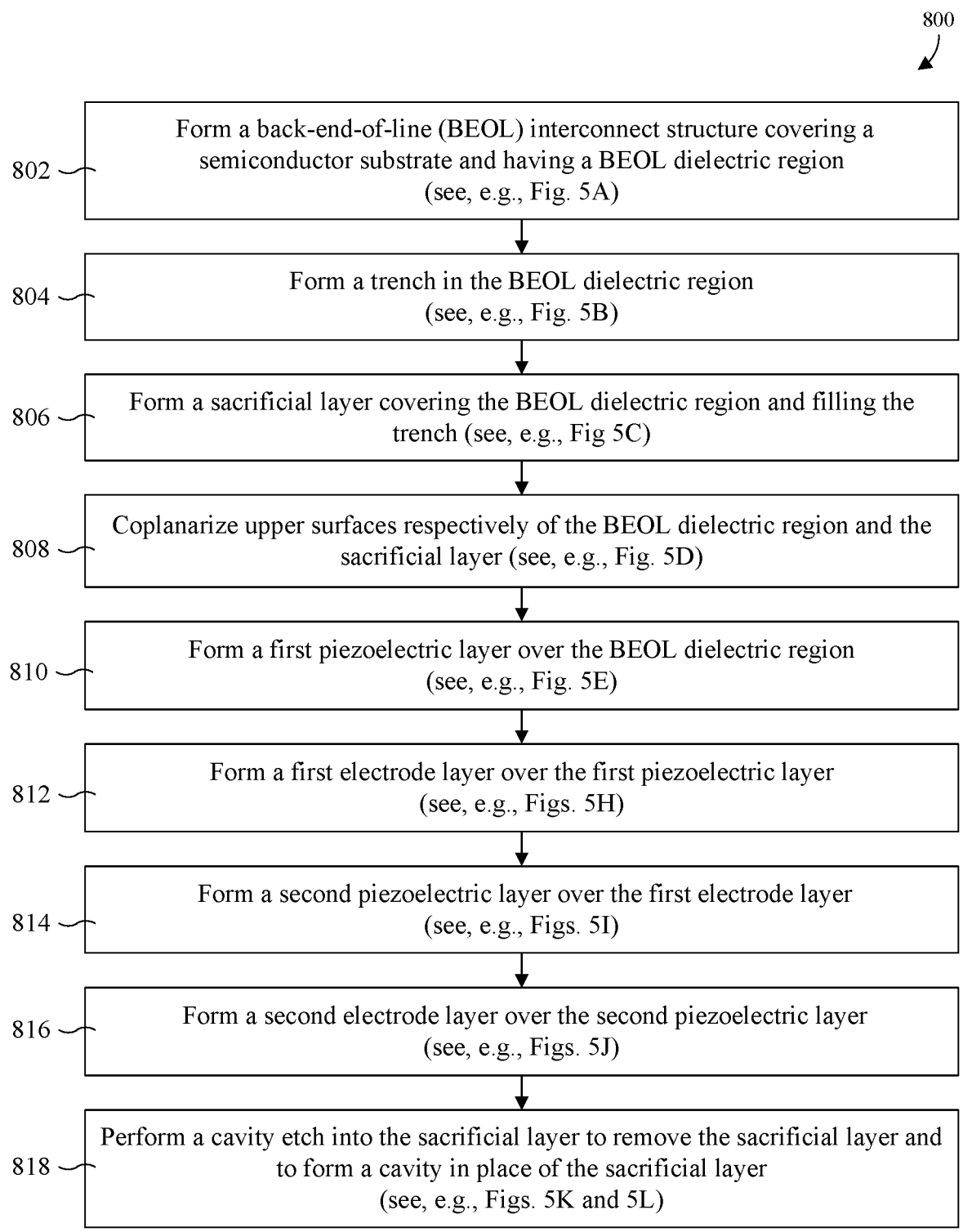
FIG. 8 illustrates a flowchart of some embodiments of the method of FIGS. 5A-5L.

With reference to FIG. 8, a flowchart 800 of some embodiments of the method of FIGS. 5A-5L is provided.

At 802, a BEOL interconnect structure is formed covering a semiconductor substrate and having one or more wiring layers stacked in a BEOL dielectric region. See, for example, FIG. 5A.

At 804, a trench is formed in the BEOL dielectric region. See for example, FIG. 5B.

At 806, a sacrificial layer is formed covering the BEOL dielectric region and filling the trench. See, for example, FIG. 5C.

At 808, a planarization is performed into upper surfaces respectively of the BEOL dielectric region and the sacrificial layer to coplanarize the upper surfaces. See, for example, FIG. 5D At 810, a first piezoelectric layer is formed over the BEOL dielectric region. See, for example, FIG. 5E.

At 812, a first electrode layer is formed over the first piezoelectric layer. See, for example, FIG. 5H.

At 814, a second piezoelectric layer is formed over the first electrode layer. See, for example, FIG. 5I.

At 816, a second electrode layer is layer is formed over the second piezoelectric layer. See, for example, FIG. 5J.

At 818, a cavity etch is performed to remove the sacrificial layer and to form a cavity in place of the sacrificial layer. See, for example, FIGS. 5K and 5L.

While the methods described by the flowcharts 600, 700, 800 of FIGS. 6-8 are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In view of the foregoing, in various embodiments of the present application provide a method for manufacturing an IC. A BEOL interconnect structure is formed covering a semiconductor substrate, where the BEOL interconnect structure comprises wiring layers stacked in a first dielectric region. A sacrificial layer is formed over the first dielectric region. A second dielectric region is formed covering the sacrificial layer and the first dielectric region. A planarization is performed into an upper surface of the second dielectric region to planarize the upper surface of the second dielectric region. A MEMS structure on the planar upper surface of the second dielectric region. A cavity etch is performed into the sacrificial layer, through the MEMS structure, to remove the sacrificial layer and to form a cavity in place of the sacrificial layer.

Further, other embodiments of the present application provide another method for manufacturing an IC. A BEOL interconnect structure is formed covering a semiconductor substrate, where the BEOL interconnect structure comprises wiring layers stacked in a dielectric region. An etch is performed into the dielectric region to form a trench in the dielectric region. A sacrificial layer is formed over the dielectric region and filling the trench. A planarization is performed into the dielectric region and the sacrificial layer to coplanarize upper surfaces respectively of the dielectric region and the sacrificial layer. A MEMS structure is formed over the planar upper surfaces respectively of the dielectric region and the sacrificial layer. A cavity etch is performed into the sacrificial layer, through the MEMS structure, to remove the sacrificial layer and to form a cavity in place of the sacrificial layer.

Further yet, other embodiments of the present application provide another IC. A BEOL interconnect structure is over a semiconductor substrate, where the BEOL interconnect structure comprises wiring layers stacked in a dielectric region, and where an upper surface of the BEOL interconnect structure is planar. A MEMS structure is over the upper surface of the BEOL interconnect structure, where the MEMS structure comprises an electrode layer. A cavity is under the upper surface of the BEOL interconnect structure, between the MEMS structure and the BEOL interconnect structure.

Further yet, other embodiments of the present application provide another IC. The other IC includes a semiconductor substrate, a BEOL interconnect structure, a MEMS structure, and a cavity. The BEOL interconnect structure is over the semiconductor substrate, and includes wiring layers stacked in a dielectric region. An upper surface of the BEOL interconnect structure is planar or substantially planar. The MEMS structure overlies and directly contacts the upper surface of the BEOL interconnect structure. The MEMS structure includes an electrode layer. The cavity is under the upper surface of the BEOL interconnect structure, between the MEMS structure and the BEOL interconnect structure. In an embodiment, an inter-device via extends from contact with the electrode layer, into the dielectric region, to contact with a top wiring layer of the BEOL interconnect structure. In an embodiment, the dielectric region includes a first dielectric region accommodating the wiring layers and defining a bottom surface of the cavity, wherein the dielectric region further includes a second dielectric region defining sidewalls of the cavity and a top surface of the cavity. In an embodiment, the dielectric region defines a bottom surface of the cavity and sidewalls of the cavity, wherein a bottom surface of the MEMS structure defines a top surface of the cavity. In an embodiment, the MEMS structure includes a piezoelectric layer defining the bottom surface of the MEMS structure and directly contacting the upper surface of the BEOL interconnect structure. In an embodiment, the MEMS structure includes: a seed layer over the upper surface of the BEOL interconnect structure, wherein the electrode layer is over the seed layer; a piezoelectric layer covering the electrode layer and the seed layer; and a second electrode layer over the piezoelectric layer, and extending through the piezoelectric layer to electrically couple with the electrode layer. In an embodiment, the second electrode layer has a U-shaped profile extending through the piezoelectric layer to direct contact with the electrode layer. In an embodiment, the IC further includes a lateral etch stop layer extending vertically from direct contact with the semiconductor substrate to direct contact with the MEMS structure, wherein the lateral etch stop layer includes a pair of segments defining sidewalls of the cavity, and wherein the segments of the lateral etch stop layer are respectively on opposite sides of the cavity.

Further yet, other embodiments of the present application provide another IC. The IC includes a semiconductor substrate, a BEOL interconnect structure, and a MEMS structure. The BEOL interconnect structure is over the semiconductor substrate, and includes a first ILD layer, a second ILD layer, a via, and a plurality of wiring layers. The wiring layers are stacked in the first ILD layer. The second ILD layer overlies the first ILD layer. The via extends through the second ILD layer, from a top wire of the wiring layers to a top surface of the second ILD layer. The first and second ILD layers collectively define a cavity. The second ILD layer defines sidewalls of the cavity and a top surface of the cavity. The MEMS structure overlies and directly contacts the top surface of the second ILD layer. An interface at which the MEMS structure directly contacts the top surface of the second ILD layer is planar or substantially planar continuously from the via to a location overlying the cavity. The MEMS structure is electrically coupled to the wiring layers by the via. In an embodiment, the second ILD layer completely covers the wiring layers and has a pair of outer sidewalls respectively on opposite sides of the cavity, wherein the outer sidewalls of the second ILD layer are respectively aligned with outer sidewalls of the first ILD layer, respectively aligned with outer sidewalls of the semiconductor substrate, and respectively aligned with outer sidewalls of the MEMS structure. In an embodiment, the MEMS structure defines sidewalls of a release opening that overlies the cavity and that opens into the cavity, wherein the release opening extends through the MEMS structure from a top of the MEMS structure to a bottom of the MEMS structure, and wherein a bottommost surface of the MEMS structure is continuous, and is planar or substantially planar, from one of the outer sidewalls of the second ILD layer to the release opening. In an embodiment, the second ILD layer further defines the sidewalls of the release opening, wherein portions of the sidewalls defined by the MEMS structure are continuous with portions of the sidewalls defined by the second ILD layer. In an embodiment, the MEMS structure includes: an electrode layer overlying and directly contacting the via and the top surface of the second ILD layer, wherein the electrode layer further overlies the cavity; and a MEMS dielectric layer covering and directly contacting the electrode layer, wherein the MEMS dielectric layer further directly contacts the top surface of the second ILD layer. In an embodiment, the MEMS structure includes: a first piezoelectric layer overlying and directly contacting the top surface of the second ILD layer; a first electrode layer overlying and directly contacting the first piezoelectric layer and the via; a second piezoelectric layer overlying and directly contacting the first piezoelectric layer and the first electrode layer; and a second electrode layer overlying and directly contacting the second piezoelectric layer, wherein the second electrode layer protrudes through the second piezoelectric layer to direct contact with the first electrode layer. In an embodiment, the second electrode layer has a U-shaped profile while protruding through the second piezoelectric layer to direct contact with the first electrode layer.

Further yet, other embodiments of the present application provide another IC. The IC includes a semiconductor substrate, a BEOL interconnect structure, and a MEMS structure. The BEOL interconnect structure is over the semiconductor substrate, and includes an ILD layer, a via, and a plurality of wiring layers. The wiring layers are stacked in the ILD layer, and the via extends through the ILD layer, from a top wire of the wiring layers to a top surface of the ILD layer. The MEMS structure overlies and directly contacts the top surface of the ILD layer. An interface at which the MEMS structure directly contacts the top surface of the ILD layer is planar or substantially planar continuously from the via to an inner sidewall of the ILD layer. The ILD layer and the MEMS structure collectively define a cavity. The ILD layer defines a bottom surface of the cavity, and further defines sidewalls of the cavity in part by the inner sidewall. The MEMS structure defines a top surface of the cavity, and the MEMS structure is electrically coupled to the wiring layers by the via. In an embodiment, the MEMS structure further includes a piezoelectric layer overlying and directly contacting the top surface of the ILD layer, wherein the interface is at least partially defined by the ILD layer and the piezoelectric layer. In an embodiment, the ILD layer has a pair of outer sidewalls respectively on opposite sides of the cavity, wherein the outer sidewalls of the ILD layer are respectively aligned with outer sidewalls of the semiconductor substrate and are respectively aligned with outer sidewalls of the piezoelectric layer. In an embodiment, the MEMS structure defines a release opening overlying the cavity and opening into the cavity, wherein the release opening extends through the MEMS structure from a top of the MEMS structure to a bottom of the MEMS structure, and wherein the interface is continuous, and is planar or substantially planar, from one of the outer sidewalls of the ILD layer to the release opening. In an embodiment, the MEMS structure includes: a first piezoelectric layer overlying and directly contacting the top surface of the ILD layer; a first electrode layer overlying and directly contacting the first piezoelectric layer and the via; a second piezoelectric layer overlying and directly contacting the first piezoelectric layer and the first electrode layer; and a second electrode layer overlying and directly contacting the second piezoelectric layer, wherein the second electrode layer protrudes through the second piezoelectric layer to direct contact with the first electrode layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the various embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) comprising:
   a substrate;
   a dielectric structure over the substrate;
   a plurality of wires and a plurality of vias stacked in the dielectric structure;
   a cavity in the dielectric structure;
   a piezoelectric structure overlying the dielectric structure and the cavity, wherein a bottom surface of the piezoelectric structure is substantially planar throughout; and
   a first metal layer buried in the piezoelectric structure and electrically coupled to the wires and the vias, wherein the first metal layer overlies the cavity and is separated from the cavity by the piezoelectric structure.

2. The IC according to claim 1, wherein the first metal layer is further separated from the cavity by a portion of the dielectric structure overlying the cavity.

3. The IC according to claim 1, wherein the bottom surface of the piezoelectric structure is in the cavity.

4. The IC according to claim 1, wherein the piezoelectric structure defines a release opening extending from an ambient environment of the IC, through the piezoelectric structure, to the cavity.

5. The IC according to claim 4, wherein the dielectric structure further defines the release opening.

6. The IC according to claim 1, wherein the piezoelectric structure directly contacts the dielectric structure at an inter-structure interface, and wherein the inter-structure interface is flat throughout.

7. The IC according to claim 1, further comprising:
   a second metal layer overlying the piezoelectric structure and the cavity and further protruding into the piezoelectric structure to the first metal layer.

8. The IC according to claim 7, wherein the second metal layer comprises a first U-shaped protrusion and a second U-shaped protrusion that both protrude to the first metal layer, and wherein the first U-shaped protrusion overlies the cavity and the second U-shaped protrusion is laterally spaced from the cavity.

9. An integrated circuit (IC) comprising:
   a substrate;
   a dielectric structure over the substrate;
   a plurality of wires and a plurality of vias stacked in the dielectric structure;
   a cavity in the dielectric structure; and
   a first electrode and a second electrode that are buried in the dielectric structure at a common elevation above the substrate and that have line-shaped profiles;
   wherein the first electrode is electrically coupled to the wires and the vias and is exposed by a pad opening defined by the dielectric structure,
   the second electrode overlies the cavity and is separated from the cavity by a movable portion of the dielectric structure, and
   the movable portion overhangs the cavity and is configured to move within the cavity.

10. The IC according to claim 9, wherein the dielectric structure further defines a release opening extending into the dielectric structure to the cavity, and wherein the movable portion is in the release opening.

11. The IC according to claim 9, wherein bottom surfaces respectively of the first and second electrodes directly contact the dielectric structure at individual interfaces, and wherein the individual interfaces are planar throughout and level with each other.

12. The IC according to claim 9, wherein the movable portion of the dielectric structure extends along a bottom surface of the second electrode and a top surface of the second electrode, and wherein the movable portion wraps around an end of the second electrode from the bottom surface of the second electrode to the top surface of the second electrode at a location directly overlying the cavity.

13. The IC according to claim 9, wherein a top surface of the cavity and a bottom surface of the cavity are defined by the dielectric structure.

14. The IC according to claim 13, wherein a sidewall of the cavity is also defined by the dielectric structure and extends from the top surface of the cavity to the bottom surface of the cavity.

15. The IC according to claim 9, wherein the cavity, the first electrode, and the second electrode each has a rectangular cross-sectional profile.

16. An integrated circuit (IC) comprising:
a substrate;
a dielectric structure over the substrate;
a plurality of wires and a plurality of vias stacked in the dielectric structure, wherein the plurality of vias and the plurality of wires respectively comprise a first via and a first wire;
a cavity in the dielectric structure and underlying an upper dielectric portion of the dielectric structure; and
a microelectromechanical systems (MEMS) structure that overlies and directly contacts the upper dielectric portion, wherein the MEMS structure and the upper dielectric portion define an opening extending through the MEMS structure from the cavity, wherein an interface at which the MEMS structure and the upper dielectric portion directly contact is continuous and smooth from the opening to the first via, and wherein the first via extends through the interface from the MEMS structure to the first wire.

17. The IC according to claim 16, wherein the cavity overlies a lower dielectric portion of the dielectric structure and is fully defined by the dielectric structure.

18. The IC according to claim 16, wherein the MEMS structure comprises an aluminum nitride structure and a first metal layer, wherein the first metal layer is buried in the aluminum nitride structure so the first metal layer both overlies and underlies the aluminum nitride structure, and wherein the first metal layer overhangs the cavity and is electrically coupled to the first wire by the first via.

19. The IC according to claim 18, wherein a bottom surface of the first metal layer is planar throughout.

20. The IC according to claim 16, wherein the dielectric structure consists essentially of a single dielectric material.

* * * * *